(12) United States Patent
Lim et al.

(10) Patent No.: US 11,205,740 B2
(45) Date of Patent: Dec. 21, 2021

(54) LIGHT EMITTING DEVICE PACKAGE AND LIGHTING DEVICE INCLUDING SAME

(71) Applicant: SUZHOU LEKIN SEMICONDUCTOR CO., LTD., Taicang (CN)

(72) Inventors: Chang Man Lim, Seoul (KR); Ki Seok Kim, Seoul (KR); Won Jung Kim, Seoul (KR); June O Song, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/643,279

(22) PCT Filed: Aug. 31, 2018

(86) PCT No.: PCT/KR2018/010130
§ 371 (c)(1),
(2) Date: Feb. 28, 2020

(87) PCT Pub. No.: WO2019/045513
PCT Pub. Date: Mar. 7, 2019

(65) Prior Publication Data
US 2020/0212276 A1 Jul. 2, 2020

(30) Foreign Application Priority Data

Sep. 1, 2017 (KR) .................. 10-2017-0111997
Sep. 15, 2017 (KR) .................. 10-2017-0119054

(51) Int. Cl.
*H01L 33/48* (2010.01)
*H01L 25/075* (2006.01)
(Continued)

(52) U.S. Cl.
CPC ........ *H01L 33/486* (2013.01); *H01L 25/0753* (2013.01); *H01L 25/167* (2013.01);
(Continued)

(58) Field of Classification Search
CPC ..... H01L 33/60; H01L 33/486; H01L 33/502; H01L 33/56; H01L 33/62; H01L 25/0753; H01L 25/167; H01L 2933/0033
See application file for complete search history.

(56) References Cited

U.S. PATENT DOCUMENTS

2013/0001599 A1  1/2013 Lee
2013/0121000 A1  5/2013 Lee et al.
(Continued)

FOREIGN PATENT DOCUMENTS

KR   10-2011-0000730   1/2011
KR   10-2013-0007170   1/2013
(Continued)

OTHER PUBLICATIONS

International Search Report dated Dec. 17, 2018 issued in Application No. PCT/KR2018/010130.

*Primary Examiner* — Feifei Yeung Lopez
(74) *Attorney, Agent, or Firm* — Birch, Stewart, Kolasch & Birch, LLP

(57) ABSTRACT

A light emitting device package according to an embodiment has a first frame and a second frame arranged to be spaced apart from each other, a third frame arranged between the first frame and the second frame and spaced apart from the first frame and the second frame, a body supporting the first to third frames, a first light emitting device arranged on the body and electrically connected to the first frame and the third frame, and a second light emitting device arranged on the body and electrically connected to the second frame and the third frame. The body has a first recess in an upper area
(Continued)

between the first frame and the third frame, and a second recess in an upper area between the third frame and the second frame. An embodiment may have a first resin part arranged in the first recess, and a second resin part arranged in the second recess. The first light emitting device has a first bonding portion and a second bonding portion, and may be arranged on the first resin part and electrically connected to the first frame and the third frame. The second light emitting device has a third bonding portion and a fourth bonding portion, and may be arranged on the second resin part and electrically connected to the second frame and the third frame.

20 Claims, 16 Drawing Sheets

(51) Int. Cl.
  *H01L 25/16* (2006.01)
  *H01L 29/866* (2006.01)
  *H01L 33/50* (2010.01)
  *H01L 33/56* (2010.01)
  *H01L 33/60* (2010.01)
  *H01L 33/62* (2010.01)

(52) U.S. Cl.
  CPC .......... *H01L 29/866* (2013.01); *H01L 33/502* (2013.01); *H01L 33/56* (2013.01); *H01L 33/60* (2013.01); *H01L 33/62* (2013.01); *H01L 2933/0033* (2013.01)

(56) References Cited

U.S. PATENT DOCUMENTS

| | | | |
|---|---|---|---|
| 2014/0183574 A1* | 7/2014 | Nakabayashi | ........ H01L 23/495 257/88 |
| 2017/0317230 A1 | 11/2017 | An | |
| 2019/0019929 A1* | 1/2019 | Lim | ...................... H01L 33/502 |

FOREIGN PATENT DOCUMENTS

| | | |
|---|---|---|
| KR | 10-2013-0054040 | 5/2013 |
| KR | 10-2014-0061797 | 5/2014 |
| KR | 10-2017-0052546 | 5/2017 |

* cited by examiner

[FIG. 1]
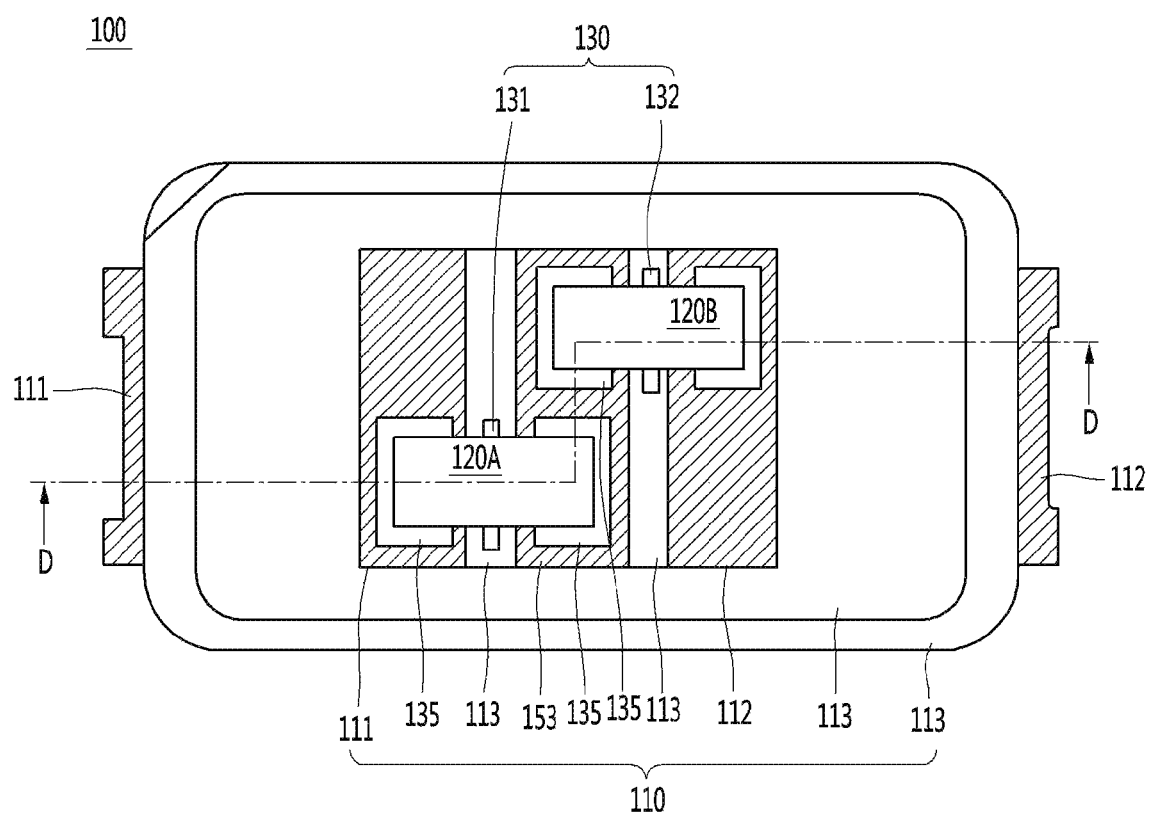

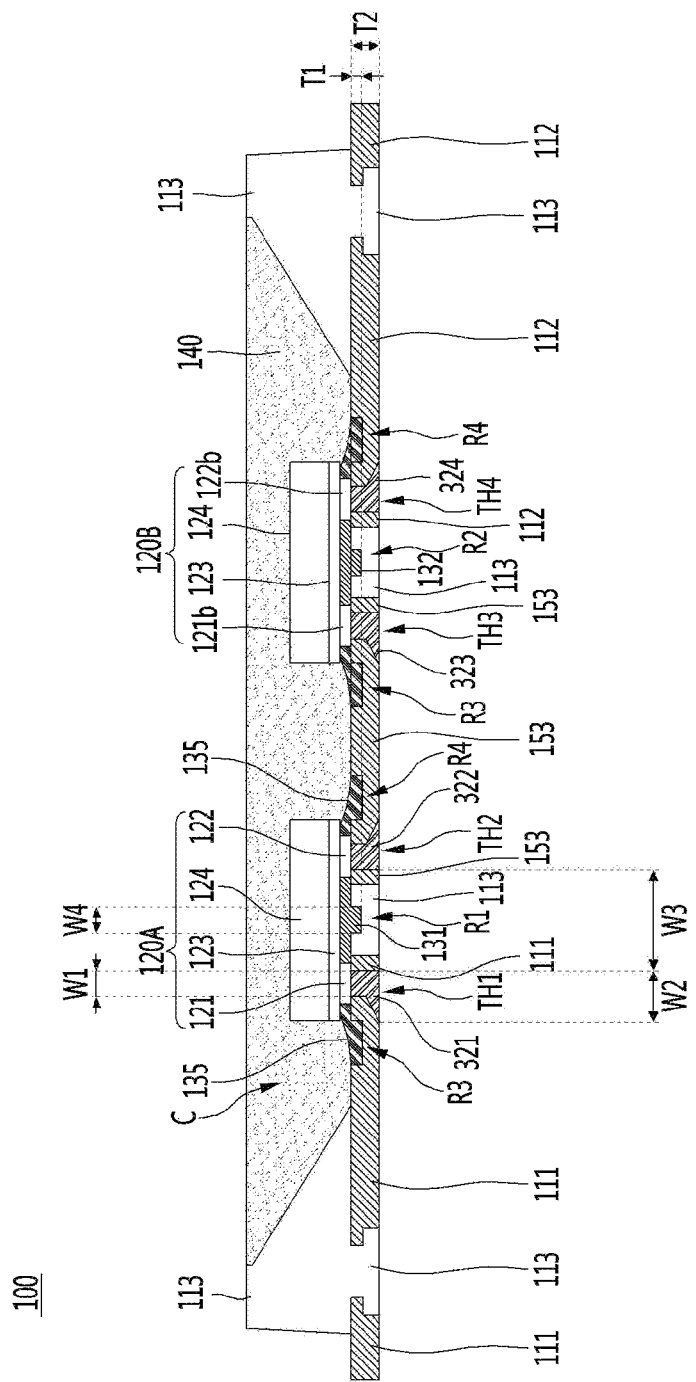
[FIG. 2]

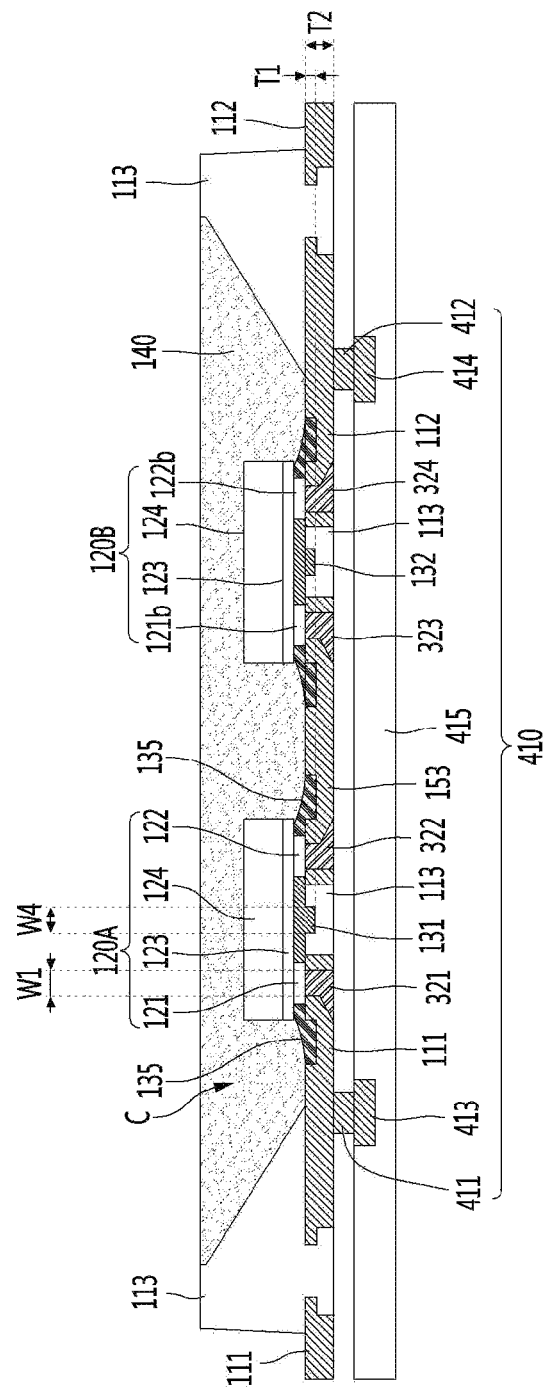
[FIG. 3]

[FIG. 4]
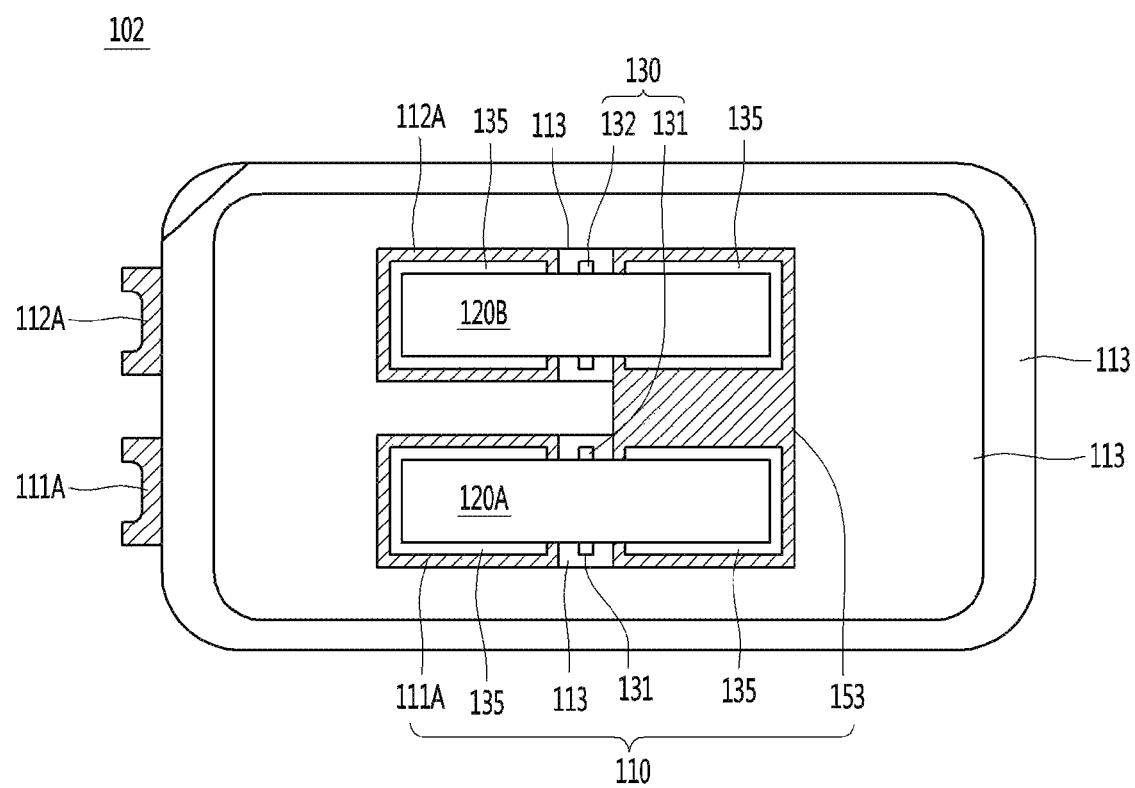

[FIG. 5]
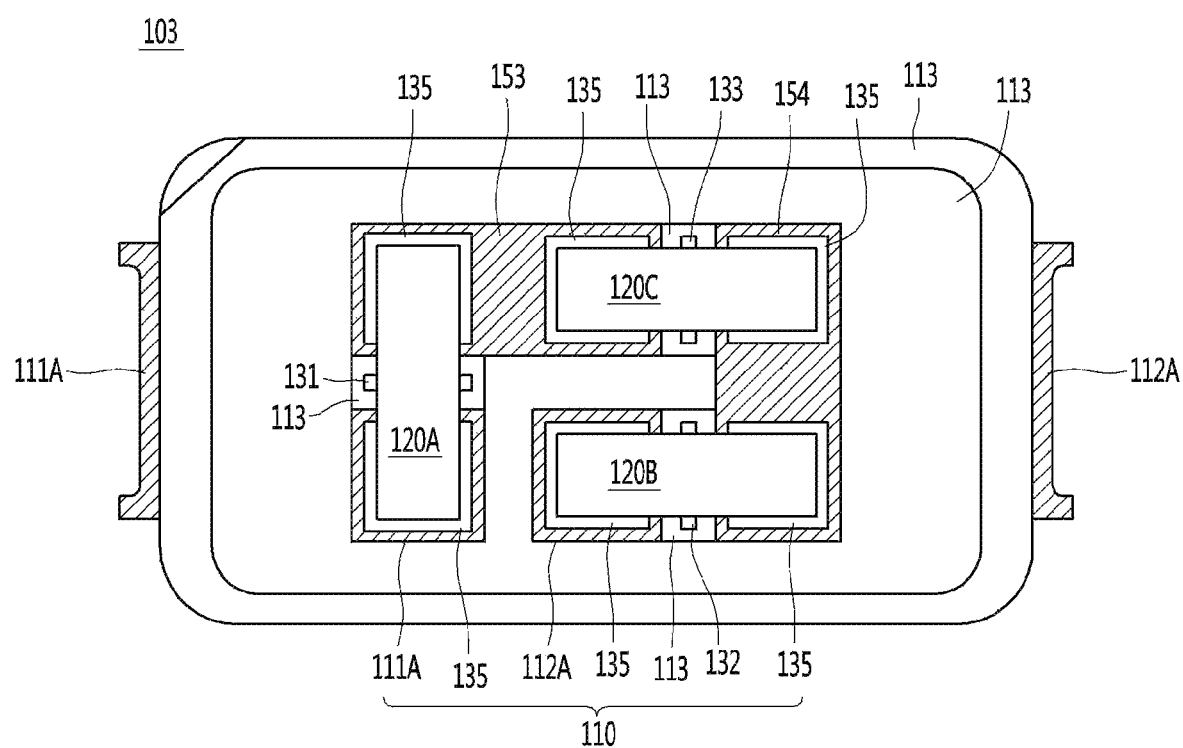

[FIG. 6]
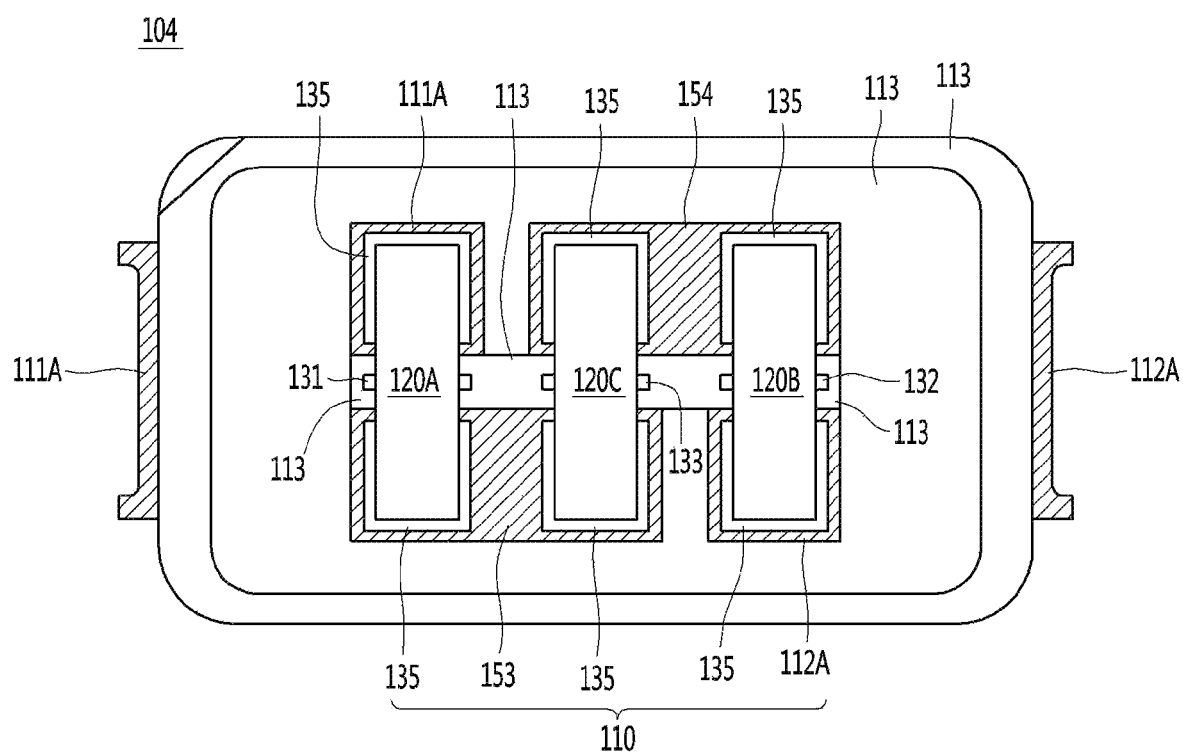

【FIG. 7】
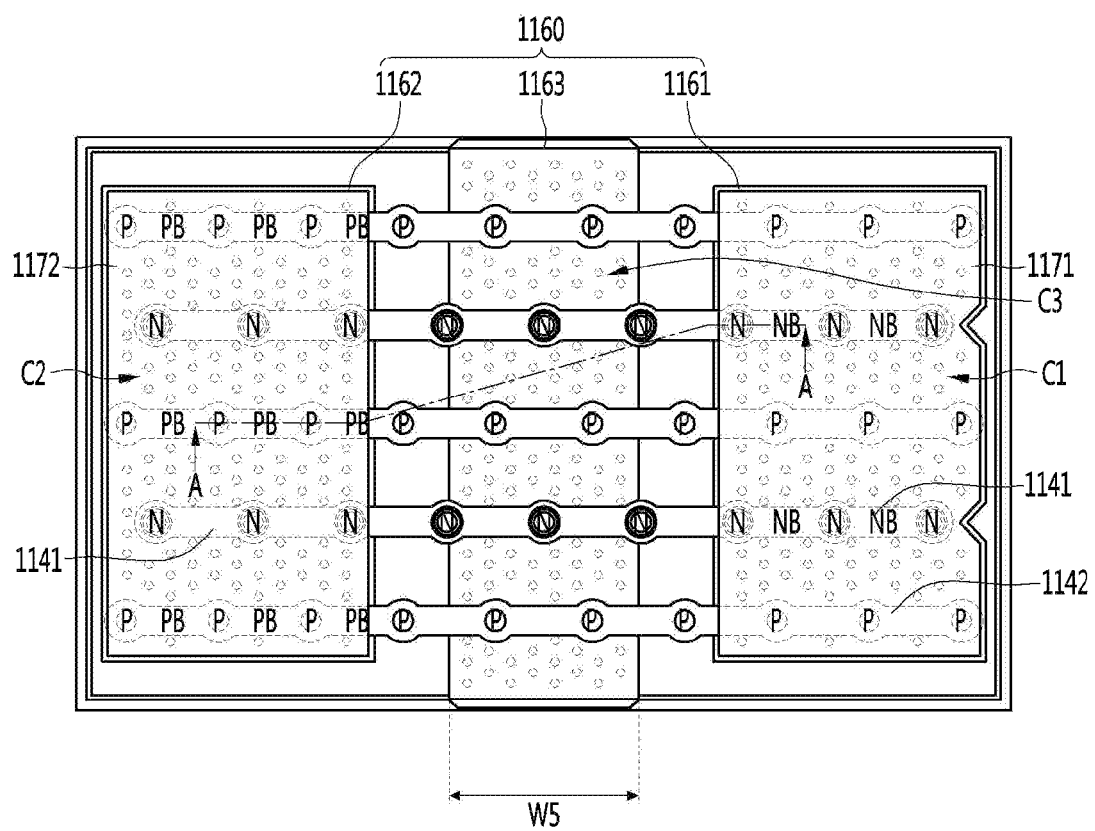

[FIG. 8]
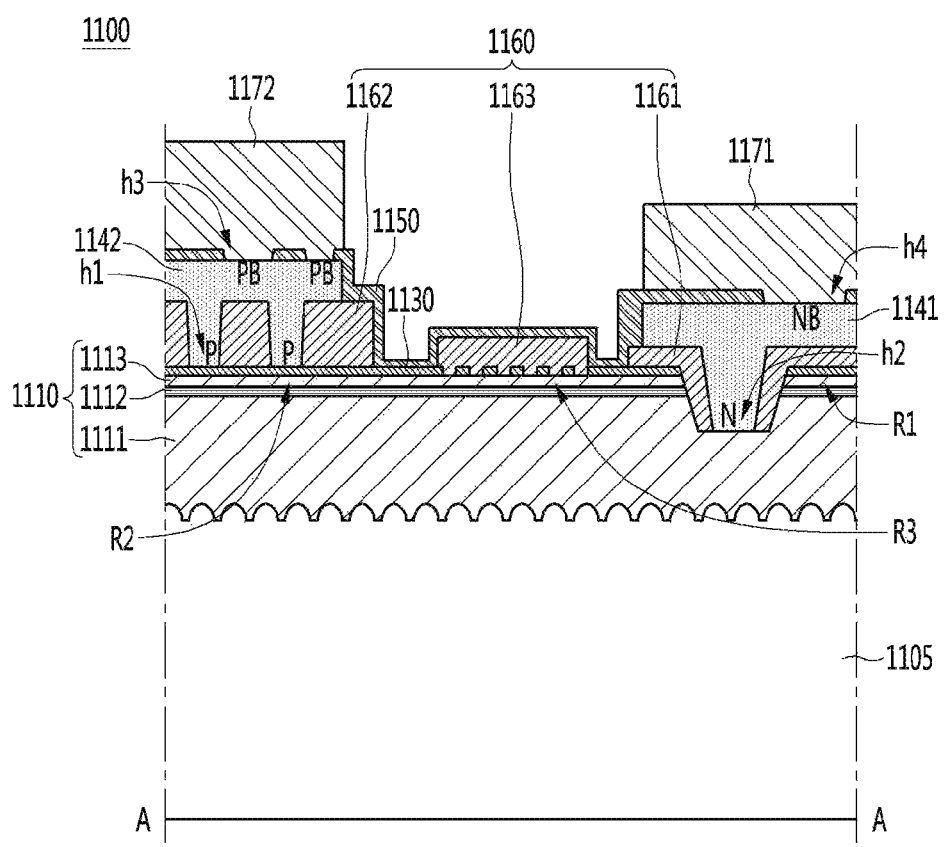

[FIG. 9]
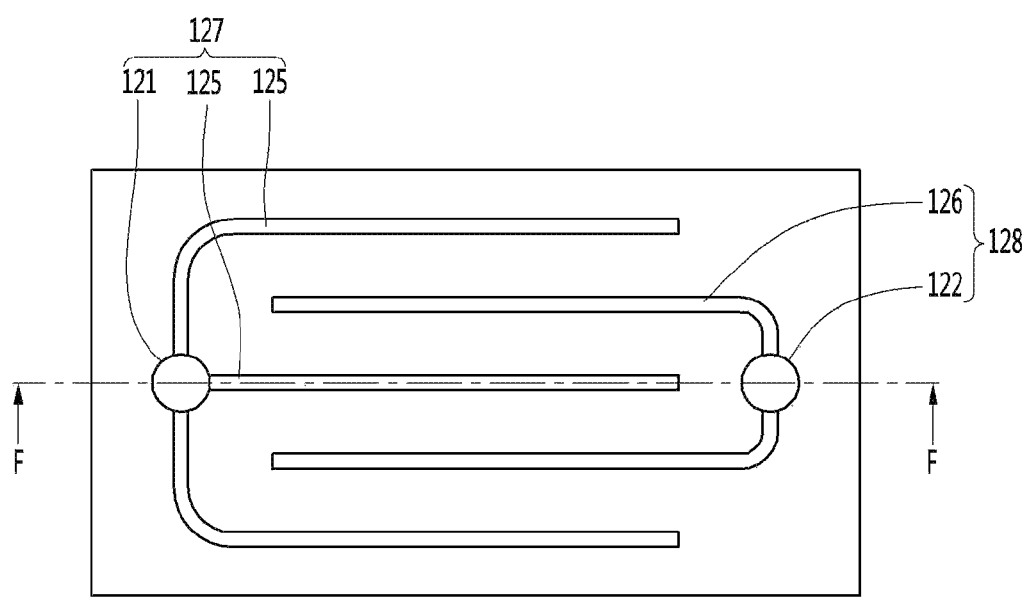

【FIG. 10】
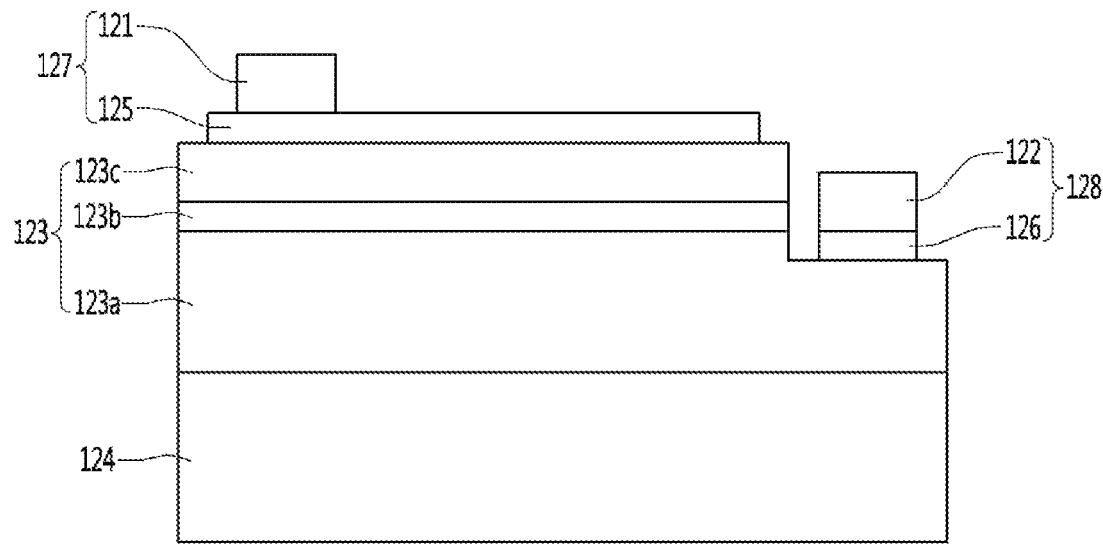
【FIG. 11】
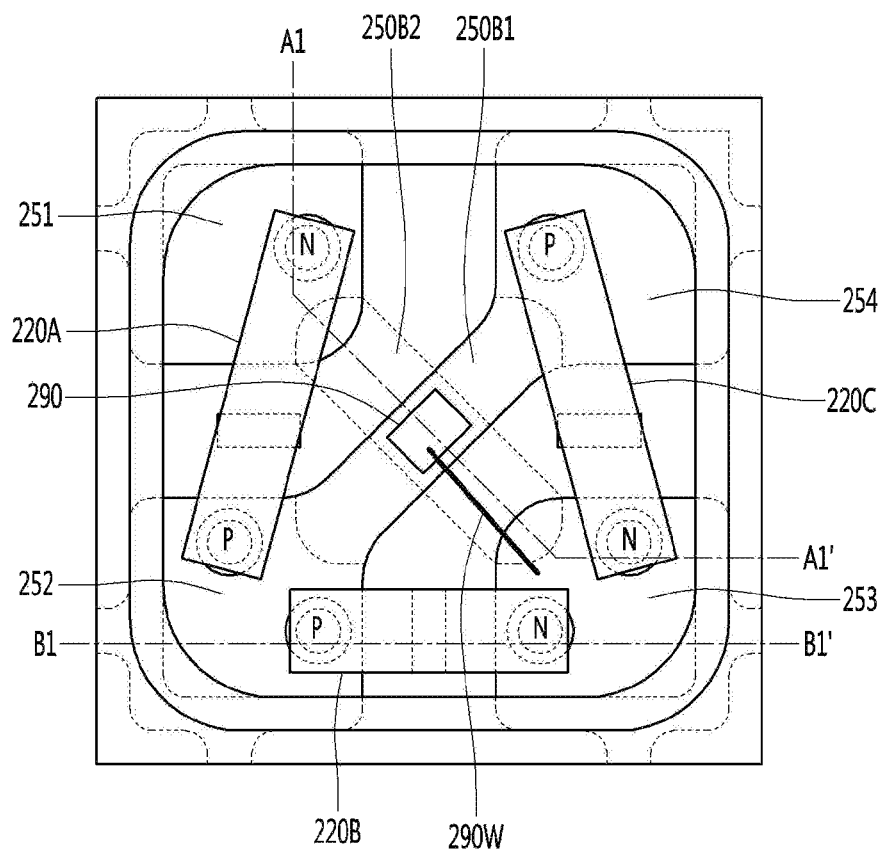

[FIG. 12]
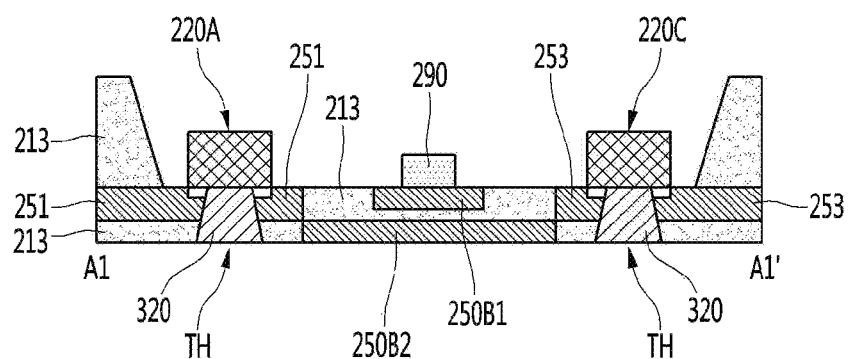
[FIG. 13]
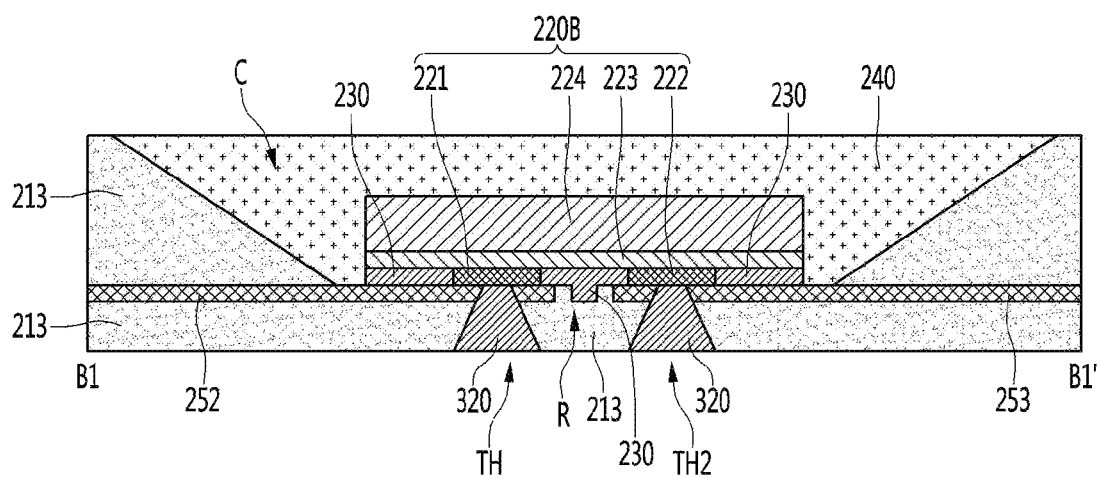

【FIG. 14】
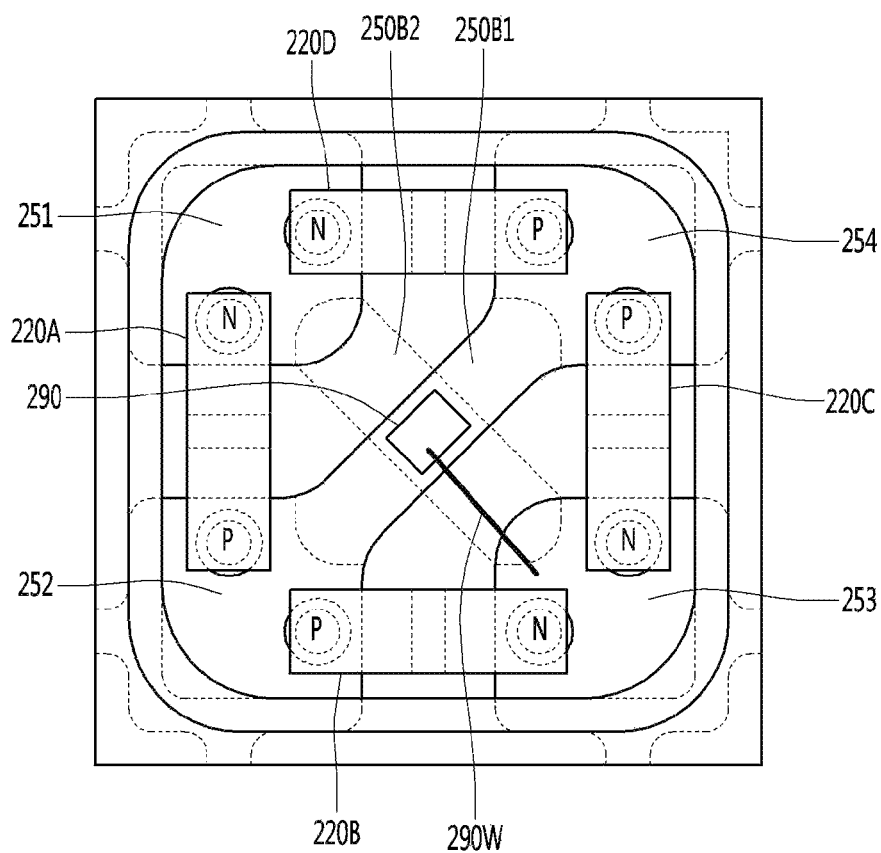

【FIG. 15】
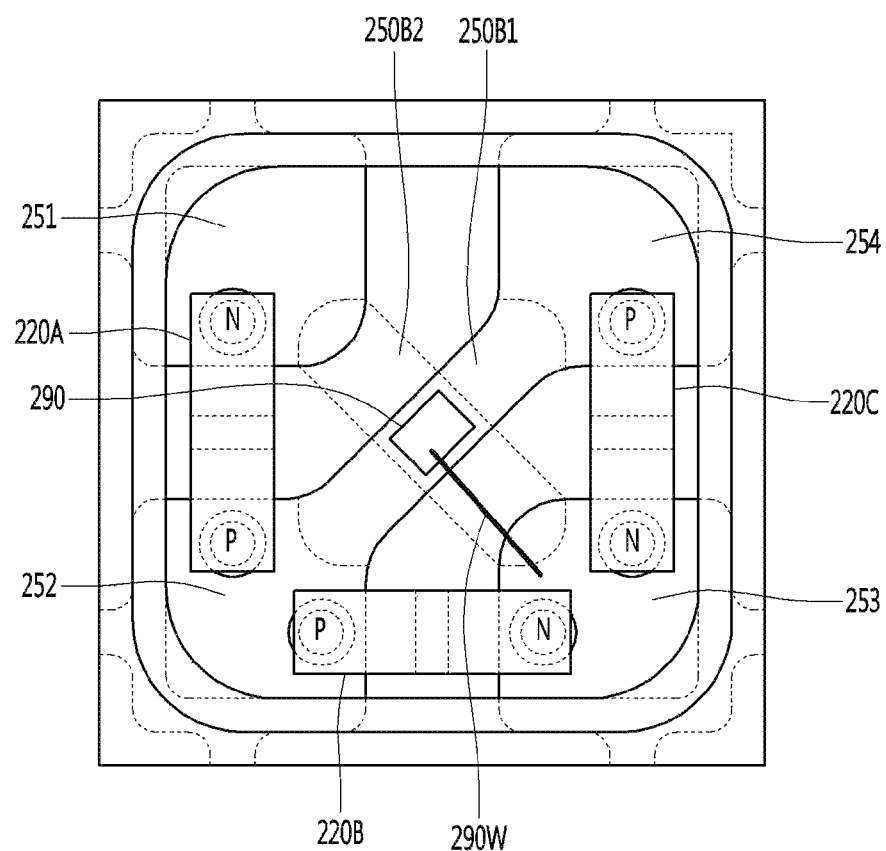

【FIG. 16】
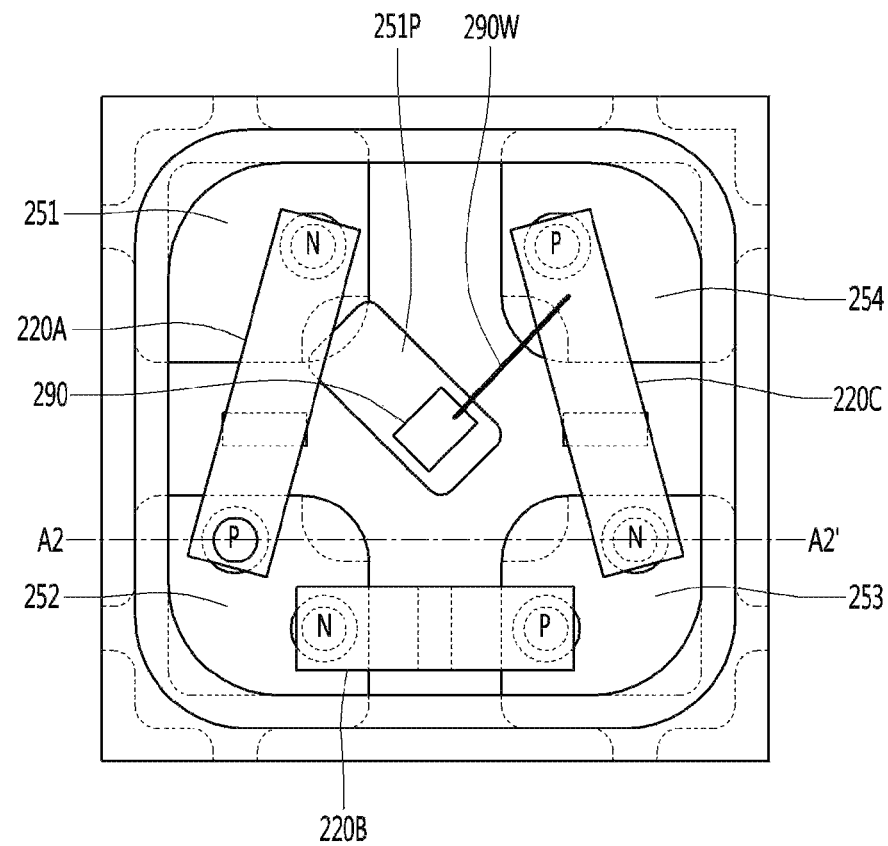
【FIG. 17】
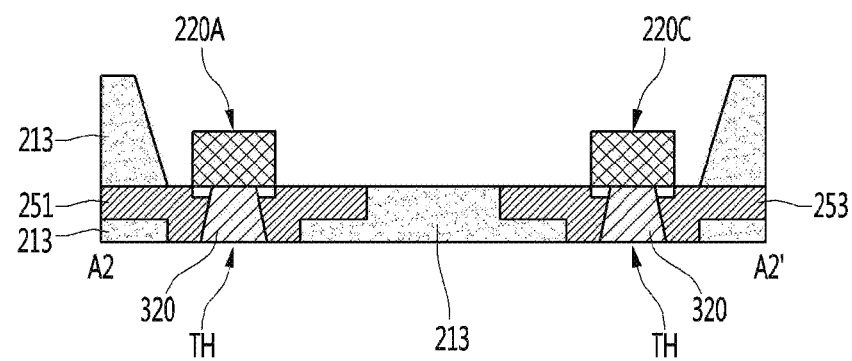

[FIG. 18]
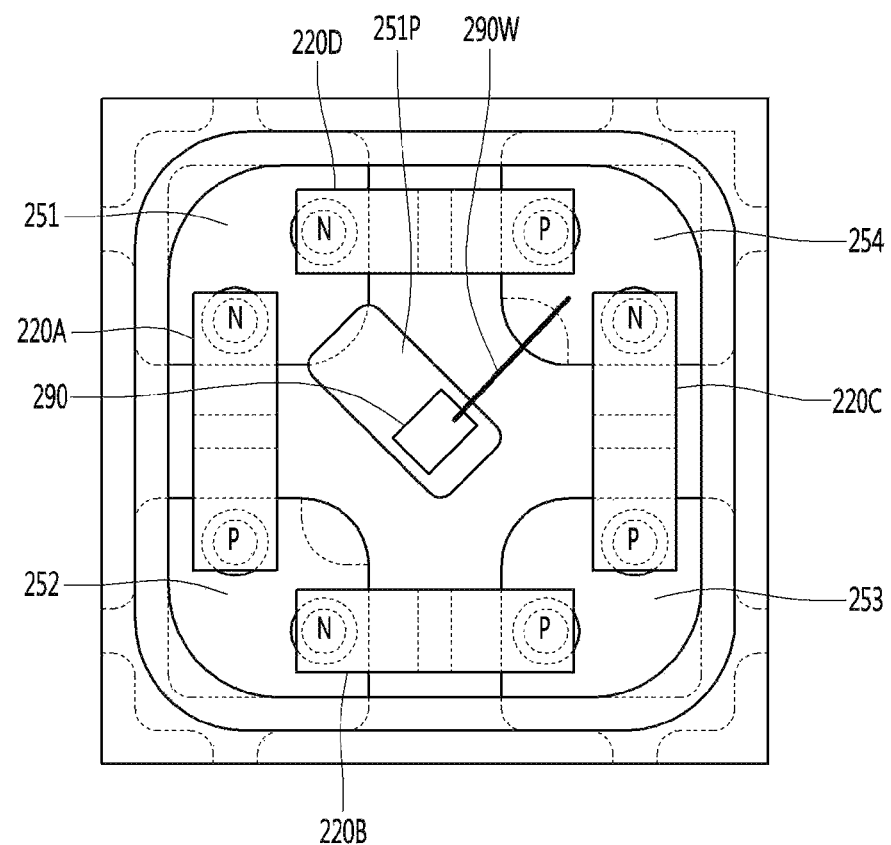

【FIG. 19】
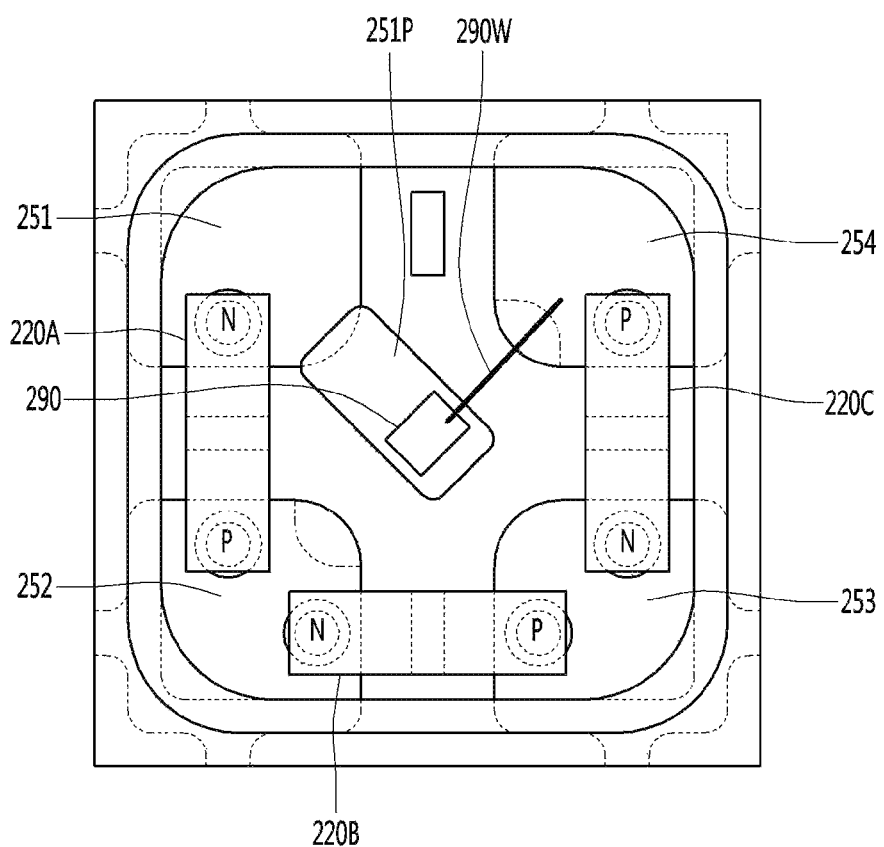

LIGHT EMITTING DEVICE PACKAGE AND LIGHTING DEVICE INCLUDING SAME

CROSS-REFERENCE TO RELATED PATENT APPLICATIONS

This application is a U.S. National Stage Application under 35 U.S.C. § 371 of PCT Application No. PCT/KR2018/010130, filed Aug. 31, 2018, which claims priority to Korean Patent Application Nos. 10-2017-0111997, filed Sep. 1, 2017 and 10-2017-0119054, filed Sep. 15, 2017, whose entire disclosures are hereby incorporated by reference.

FIELD OF THE INVENTION

Background Art

The embodiment relates to a light emitting device package, a manufacturing method for the light emitting device package, and a lighting device.

Background Art

A semiconductor device including a compound such as GaN, AlGaN, etc. has many advantages, such as having a wide and easy to adjust band gap energy, and can be used in various ways as a light emitting device, a light receiving device, and various diodes.

In particular, light emitting devices such as light emitting diodes or laser diodes using group 3-5 or 2-6 compound semiconductor materials have been developed using thin film growth technology and device materials. There is an advantage that can implement light of various wavelength bands such as blue and ultraviolet.

In addition, a light emitting device such as a light emitting diode or a laser diode using a group 3-5 or 2-6 compound semiconductor material can be implemented with a white light source having high efficiency by using a fluorescent material or a combination of colors.

Such a light emitting device has advantages of low power consumption, semi-permanent life, fast response speed, safety and environmental friendliness compared to conventional light sources such as fluorescent lamps and incandescent lamps.

In addition, when a light-receiving device such as a photodetector or a solar cell is also fabricated using a group 3-5 or group 2-6 compound semiconductor material, development of device materials absorbs light in various wavelength ranges to generate photocurrent. As a result, light in various wavelength ranges, from gamma rays to radio wavelength ranges, can be used. In addition, such a light receiving element has the advantages of fast response speed, safety, environmental friendliness and easy adjustment of the device material can be easily used in power control or ultra-high frequency circuit or communication module.

Accordingly, the semiconductor device may replace a light emitting diode backlight, a fluorescent lamp, or an incandescent bulb that replaces a cold cathode tube (CCFL) constituting a backlight module of an optical communication means, a backlight of a liquid crystal display (LCD) display device. Applications are expanding to include white light emitting diode lighting devices, automotive headlights and traffic lights, and sensors that detect gas or fire. In addition, the semiconductor device may be extended to high frequency application circuits, other power control devices, and communication modules.

The light emitting device may be provided as a pn junction diode having a property in which electrical energy is converted into light energy using, for example, a group 3-5 element or a group 2-6 element on the periodic table. Various wavelengths can be realized by adjusting the composition ratio.

For example, nitride semiconductors are receiving great attention in the field of optical devices and high power electronic devices due to their high thermal stability and wide bandgap energy.

In particular, a blue light emitting device, a green light emitting device, an ultraviolet light emitting device, a red light emitting device, etc. using nitride semiconductors are commercially used and widely used.

For example, in the case of an ultraviolet light emitting device, a light emitting diode which emits light distributed in a wavelength range of 200 nm to 400 nm, and is used in the wavelength band, for short wavelengths, for sterilization and purification, and for long wavelengths, an exposure machine or a curing machine can be used.

Ultraviolet rays can be classified into UV-A (315 nm~400 nm), UV-B (280 nm~315 nm), and UV-C (200 nm~280 nm) in order of long wavelength.

The UV-A (315 nm~400 nm) area is applied to various fields such as industrial UV curing, printing ink curing, exposure machine, forgery discrimination, photocatalyst sterilization, special lighting (aquarium/agriculture, etc.), and UV-B (280 nm~315 nm).) Area is used for medical purposes, and UV-C (200 nm~280 nm) area is applied to air purification, water purification and sterilization products.

On the other hand, according to the related art, there is an issue of bonding force between the package body and the light emitting device, and thus there is a reliability issue due to the decrease in bonding force.

In addition, in the light emitting device package of the related art, there is a bonding coupling force between the electrode of the package body and the light emitting device and the reliability of the bonding.

For example, a conventional light emitting device package is mounted on a sub-mount or a circuit board, a high temperature process such as a reflow is applied. In this case, in the reflow process, bonding between a lead frame and a light emitting device provided in the light emitting device package is performed. The re-melting phenomenon occurs in the region, and the stability of the electrical connection or the physical bonding bond is weakened, thereby causing a problem of electrical and physical reliability.

In addition, as a light emitting device capable of providing a high output is required in current and future technologies, research on a light emitting device capable of increasing output by applying a high power source is being conducted, but the countermeasure thereof is weak.

In particular, when high power is applied to the light emitting device, reliability may be degraded in the light emitting device, and when a plurality of light emitting devices are used, the size of the semiconductor package may increase.

In addition, in the related art, research is being conducted to improve the light extraction efficiency of the light emitting device and to improve the brightness at the package stage.

In addition, in the light emitting device package in the related art, research has been conducted on a method for reducing manufacturing cost and improving manufacturing yield by improving process efficiency and structural change.

DISCLOSURE

Summary of the Invention

One of the technical problems to be solved of the embodiment is to provide a light emitting device package, a manufacturing method thereof, and a lighting device including the same, which can improve bonding force between a package body and a light emitting device.

In addition, one of the technical problems to be solved of the embodiment is to provide a light emitting device package, a manufacturing method thereof and a lighting device including the same that can solve the problem of electrical and physical reliability in the bonding region between the electrode of the package body and the light emitting device electrode.

In addition, one of the technical problems to be solved of the embodiment is to provide a light emitting device package having high reliability while providing high output and compact semiconductor package size, a manufacturing method thereof, and a lighting device including the same.

In addition, one of the technical problems to be solved of the embodiment is to provide a light emitting device package that can improve the brightness, a manufacturing method thereof and a lighting device including the same.

In addition, one of the technical problems to be solved of the embodiment is to provide a light emitting device package, a manufacturing method thereof, and a lighting device including the same, which can reduce manufacturing cost and improve manufacturing yield by improving process efficiency and changing a structure.

The technical problem of the embodiments is not limited to the matters described in this item, and includes those that can be understood through the description of the invention.

The light emitting device package according to the embodiment may include a first frame 111 and a second frame 112 spaced apart from each other, a third frame 153 disposed between the first frame 111 and the second frame 112 and spaced apart from the first frame 111 and the second frame 112; a body 113 for supporting the first to third frame (111, 112, 153), a first light emitting device 120A disposed on the body 113 and electrically connected to the first frame 111 and the third frame 153, and a second light emitting device 120B disposed on the body 113 and electrically connected to the second frame 112 and the third frame 153.

The body 113 may include a first recess R1, a third frame 153, and a second frame 112 in an upper region between the first frame 111 and the third frame 153. The second recess R2 may be included in an upper region therebetween.

The embodiment may include a first resin part 131 disposed in the first recess R1 and a second resin part 132 disposed in the second recess R2.

The first light emitting device 120A includes a first bonding part 121 and a second bonding part 122, and is disposed on the first resin part 131 to form the first frame 111 and the first material, and may be electrically connected to the third frames 153.

The second light emitting device 120B includes a third bonding part 121b and a fourth bonding part 122b, and is disposed on the second resin part 132 to form the second frame 112 and the first material and may be electrically connected to the third frames 153.

In addition, the light emitting device package according to the embodiment comprises a plurality of frames spaced apart from each other, a body for supporting the plurality of frames, a plurality of light emitting devices disposed on the plurality of frames and a first resin disposed between the body and the light emitting device.

Each of the frames may include at least one through hole, and the body may include an upper surface of the same plane as the upper surface of the frame, and the upper surface of the body may include a recess recessed to the lower surface of the body between the frames.

The first resin may be disposed in the recess, and both the through hole and the recess may overlap the light emitting device.

Advantageous Effects

According to an embodiment, it is possible to provide a light emitting device package, a manufacturing method thereof, and a lighting device including the same, which may improve bonding force between a package body and a light emitting device.

In addition, according to the embodiment, it is possible to provide a light emitting device package having an excellent electrical and physical reliability in the bonding region between the electrode of the package body and the electrode of the light emitting device, a manufacturing method thereof and a lighting device including the same.

For example, according to the light emitting device package and the manufacturing method for the light emitting device according to the embodiment, the re-melting phenomenon is prevented from occurring in the bonding region of the light emitting device package while the light emitting device package is rebonded to the substrate or the like.

In addition, according to the embodiment, it is possible to provide a light emitting device package, a manufacturing method thereof, and a lighting device including the same, providing a high output and excellent reliability, and a compact semiconductor package size.

In addition, according to the embodiment, it is possible to provide a light emitting device package, a manufacturing method thereof, and a lighting device including the same, which can improve the brightness.

In addition, according to the embodiment, it is possible to provide a light emitting device package, a manufacturing method thereof, and a lighting device including the same, which can reduce manufacturing cost and improve manufacturing yield by improving process efficiency and changing a structure.

The technical effects of the embodiments are not limited to those described in this section, but include those that can be understood through the description of the invention.

BRIEF DESCRIPTION OF DRAWINGS

FIG. 1 is a plan view of a light emitting device package according to a first embodiment;

FIG. 2 is a cross-sectional view taken along line D-D of the light emitting device package shown in FIG. 1.

FIG. 3 is a conceptual diagram in which the light emitting device package shown in FIG. 1 is disposed on a circuit board.

FIG. 4 is a plan view of a light emitting device package according to a second embodiment;

FIG. 5 is a plan view of a light emitting device package according to a third embodiment;

FIG. 6 is a plan view of a light emitting device package according to a fourth embodiment;

FIG. 7 is a plan view showing an example of a light emitting device applied to the light emitting device package according to the embodiment.

FIG. 8 is a cross-sectional view taken along the line A-A of the light emitting device shown in FIG. 7.

FIG. 9 is a plan view illustrating an electrode arrangement of a light emitting device applied to a light emitting device package according to an embodiment.

FIG. 10 is a cross-sectional view taken along line F-F of the light emitting device shown in FIG. 9;

FIGS. 11 and 12 are a plan view and a cross-sectional view of a light emitting device package according to a fifth embodiment.

FIG. 13 is a cross-sectional view of a light emitting device package according to a fifth embodiment.

FIG. 14 is a plan view of a light emitting device package according to a sixth embodiment.

FIG. 15 is a plan view of a light emitting device package according to a seventh embodiment.

FIGS. 16 and 17 are a plan view and a sectional view of the light emitting device package according to the eighth embodiment.

FIG. 18 is a cross-sectional view of a light emitting device package according to a ninth embodiment.

FIG. 19 is a plan view of a light emitting device package according to the tenth embodiment.

DETAILED DESCRIPTION OF THE INVENTION

Hereinafter, embodiments will be described with reference to the accompanying drawings.

In the description of an embodiment,

In the case where it is described as each layer, region, pattern, or structure being "on/over" or "under" a substrate, each layer, region, pad, or pattern include both "directly" or "indirectly" formed. In addition, the criteria for the above/ above or below each layer will be described with reference to the drawings, but embodiments are not limited thereto.

Hereinafter, a light emitting device package and a manufacturing method for the light emitting device package according to an embodiment will be described in detail with reference to the accompanying drawings. Hereinafter, a description will be given based on a case where a light emitting device is applied as an example of a semiconductor device.

First Embodiment

First, the light emitting device package 100 according to the first embodiment will be described with reference to FIGS. 1 and 2.

FIG. 1 is a plan view of a light emitting device package 100 according to a first embodiment, and FIG. 2 is a cross-sectional view taken along a line D-D of the light emitting device package shown in FIG. 1.

As shown in FIG. 1, the light emitting device package 100 according to the first embodiment may include a package body 110 and a plurality of light emitting devices disposed on the package body 110 to implement a high output light output.

For example, the embodiment may include the first light emitting device 120A and the second light emitting device 120B, but the present invention is not limited thereto, and three or more light emitting devices may be provided to implement a high output light output.

The package body 110 may include a plurality of frames. For example, the package body 110 may include a first frame 111, a second frame 112, and a third frame 153 spaced apart from each other, but is not limited thereto and may include four or more frames.

In this case, the first frame 111 and the second frame 112 may be directly supplied with power from an electrode of a separate circuit board, and the third frame 153 may not be directly supplied with power. Also, it may be referred to as an intermediate frame, a connecting frame, a bridge frame, or the like, and the plurality of light emitting devices are connected in series to enable the application of high power to realize high output light output (6V, 9V, 12V, etc.) When the power is directly applied to the third frame 153 which is an intermediate frame, a dimming function may also be implemented.

In addition, the package body 110 may include a body 113 that functions as a support, and may be include a Branch 130 being an adhesive function on an upper region overlapping the first light emitting device 120A and the second light emitting device 120B.

For example, the exemplary embodiment includes a package body including a first resin part 131 and a second resin part 132 in an upper region overlapping the first light emitting device 120A and the second light emitting device 120B. Bonding strength between the package body and the light emitting device can be improved.

In addition, the first resin part 131 and the second resin part 132 may extend to the outside of the first light emitting device 120A and the second light emitting device 120B, respectively. The electrical reliability can be improved by preventing the electrical short circuit by blocking the lateral expansion of paste.

In addition, the package body 110 may include a fifth resin part 135 around the first and second light emitting devices 120A and 120B.

For example, the fifth resin part 135 may be disposed below and/or on the side surfaces of the first and second light emitting devices 120A and 120B to perform a sealing function.

In addition, the fifth resin part 135 may improve the adhesive force between the first and second light emitting devices 120A and 120B and the first to third frames 111, 112, and 153.

Hereinafter, the technical features of the present invention will be described in more detail with reference to FIG. 2.

(Body, Recess of the Body, Resin Part)

Referring to FIG. 2, the light emitting device package 100 according to the embodiment may include a first frame 111, a second frame 112, and a third frame 153 spaced apart from each other on a body 113 constituting the package body.

The first light emitting device 120A may be disposed on the body 113 and electrically connected to the first frame 111 and the third frame 153, and the second light emitting device 120B may be disposed on the body 113 and may be electrically connected to the second frame 112 and the third frame 153.

The body 113 may be disposed between the first frame 111, the third frame 153, and the second frame 112. The body 113 may perform a function of a kind of electrode separation line. The body 113 may be referred to as an insulating member.

For example, the body 113 may be made at least one selected from the group consisting of polyphthalamide (PPA), polychloro triphenyl (PCT), liquid crystal polymer (LCP), polyamide 9T (PA9T), silicon, epoxy molding compound (EMC), silicon molding compound (SMC), ceramic, photo sensitive glass (PSG), sapphire (Al2O3) and the like. In addition, the body 113 may include a high refractive filler such as TiO2 and SiO2.

In addition, the body 113 may be disposed to extend to one side of the first frame 111. In addition, the body 113 may be disposed to extend upwardly on one side of the second frame 112. Through this, the body 113 may provide an inclined surface disposed above the first frame 111 and the second frame 112. A cavity C may be provided on the first frame 111 and the second frame 112 by the inclined surface of the body 113.

According to an embodiment, the package body 110 may be provided in a structure having a cavity C, or may be provided in a structure having a flat top surface without the cavity C.

One of the technical problems to be solved of the embodiment is to provide a light emitting device package, a manufacturing method thereof, and a lighting device including the same, which can improve bonding force between a package body and a light emitting device.

In order to solve this technical problem, the light emitting device package 100 according to the embodiment includes a recess in the upper region of the body 113, as shown in FIG. 2, the resin part 130 (see FIG. 1) is disposed in the recess.

For example, in the embodiment, the body 113 may include the first recess R1 and the third frame 153 and the first recess R1 formed in an upper region between the first frame 111 and the third frame 153. It may include a second recess R2 formed in the upper region between the second frame 112 and the third frame 153.

The first recess R1 and the second recess R2 may be recessed in a lower surface direction on an upper surface of the body 113. The first recess R1 may be disposed under the first light emitting device 120A. The second recess R2 may be disposed under the second light emitting device 120B.

According to an embodiment, the first resin part 131 disposed in the first recess R1 of the body 113 and the second resin part 132 disposed in the second recess R2 of the body 113 are provided. The first and second resin parts 131 and 132 may be disposed between the first and second light emitting devices 120A and 120B and the body 113 to form the body 113 and the first body. The coupling force between the light emitting device 120A and the second light emitting device 120B can be increased.

The resin unit 130 may include at least one of an epoxy-based material, a silicon-based material, a hybrid material including an epoxy-based material and a silicon-based material.

Accordingly, the resin part 130 may provide a stable fixing force between the first and second light emitting devices 120A and 120B and the package body 110.

According to the embodiment, a light emitting device package capable of improving bonding strength between the package body and the light emitting device, a manufacturing method thereof, and a lighting device including the same can be provided.

The resin part 130 may be disposed in direct contact with the upper surface of the body 113. In addition, the resin part 130 may be disposed in direct contact with lower surfaces of the first and second light emitting devices 120A and 120B.

In addition, in the embodiment, when light is emitted to the lower surfaces of the first and second light emitting devices 120A and 120B, the resin part 130 may include the first and second light emitting devices 120A and 120B and the body. By providing a light diffusion function between the first and second light emitting devices 120A and 120B and the body 113 to improve the light extraction efficiency of the light emitting device package 100.

In addition, in the embodiment, the resin part 130 may reflect light emitted from the first and second light emitting devices 120A and 120B. When the resin part 130 includes a reflection function, the resin part 130 may be made of a material including TiO2, Silicone, and the like, and the resin part 130 is made of white silicone.

Accordingly, according to the embodiment, it is possible to provide a light emitting device package, a manufacturing method thereof, and a lighting device including the same, which can improve the brightness.

In addition, referring to FIG. 1, the first resin part 131 and the second resin part 132 may extend to the outside of the first light emitting device 120A and the second light emitting device 120B, respectively. In this case, the electrical reliability can be improved by preventing the electrical short circuit by blocking the side expansion such as paste during the bonding process.

Referring back to FIG. 2, in an embodiment, the depth T1 of the first and second recesses R1 and R2 may be determined in consideration of the adhesive force of the resin part 130, and the stable of the body 113 may be determined. In consideration of the intensity or by heat emitted from the first and second light emitting devices 120A and 120B, it may be determined that no crack occurs in the light emitting device package 100.

The first and second recesses R1 and R2 may provide an appropriate space in which a kind of under-fill process may be performed under the first and second light emitting devices 120A and 120B. In the under-fill process, the first and second light emitting devices 120A and 120B are mounted on the package body 110, and the resin part 130 is mounted on the first and second light emitting devices 120A, 120B, respectively.

Alternatively, in order to mount the first and second light emitting devices 120A and 120B to the package body 110 through the resin part 130, the resin part 130 may be mounted on the first and second light emitting devices 120A and 120B after the resin part 130 is disposed in the recesses R1 and R2.

Referring to FIG. 2, the depth T1 and the width W4 of the first recess R1 may affect the formation position and the fixing force of the resin part 130. For example, the depth T1 and the width W4 of the first recess R1 may be formed in the first resin part 131 disposed between the body 113 and the first light emitting device 120A. By means of which a sufficient holding force can be provided.

For example, the depth T1 of the first recess R1 may be provided in several tens of micrometers. The depth T1 of the first recess R1 may be provided at 40 micrometers to 60 micrometers.

In addition, the width W4 of the first recess R1 may be provided in several tens of micrometers to several hundred micrometers. Here, the width W4 of the first recess R1 is provided in the long axis direction of the first light emitting device 120A to secure a fixing force between the first light emitting device 120A and the package body 110.

The depth T1 and the width (not shown) of the second recess R2 may also adopt the features of the depth T1 and the width W4 of the first recess R1.

In an embodiment, the width W4 of the first recess R1 may be narrower than a distance between the first bonding portion 121 and the second bonding portion 122 of the first light emitting device 120A. The width W4 of the first recess R1 may be provided in a range of 5% or more and 80% or less with respect to the long axis length of the first light emitting device 120A.

When the width W4 of the first recess R is provided as 5% or more of the long axis length of the first light emitting device 120A, a Stability between the first light emitting device 120A and the package body 110 can be obtained. When the fixing force is secured and provided at 80% or less, the first resin part 131 is disposed between the first recess R1 and the first and second openings TH1 and TH2 (see FIG. 2). Each of the first and third frames 111 and 153 may be disposed. Therefore, a fixing force between the first and third frames 111 and 153 and the first light emitting device 120A between the first recess R1 and the first and second openings TH1 and TH2 may be secured.

Accordingly, according to the embodiment, it is possible to provide a light emitting device package, a manufacturing method thereof, and a lighting device including the same, which can improve bonding force between the package body and the light emitting device.

In addition, according to the embodiment, it is possible to provide a light emitting device package, a manufacturing method thereof, and a lighting device including the same, which can improve the brightness.

(First to Third Frame, Light Emitting Device, Opening of Frame, Conductive Layer of Opening)

In addition, one of the technical problems to be solved of the embodiment is to provide a light emitting device package that can solve the problem of electrical and physical reliability in the bonding region between the electrode of the package body and the electrode of the light emitting device, a manufacturing method thereof and a lighting device including the same.

In addition, one of the technical problems to be solved of the embodiment is to provide a light emitting device package having high reliability while providing high output and compact semiconductor package size, a manufacturing method thereof, and a lighting device including the same.

Referring to FIG. 2, an embodiment may include a first frame 111, a second frame 112, and a third frame 153 spaced apart from each other, and the present invention is not limited thereto and may include four or more frames.

In an embodiment, the first frame 111 and the second frame 112 may stably provide structural strength of the package body 110, and may be formed of a conductive material and electrically connected to the light emitting device, it is not limited to this.

In particular, the embodiment may comprise the third frame 153 disposed between the first frame 111 and the second frame 112, and the third frame 153 is spaced apart from the first frame 111, the second frame 112. The third frame 153 may also stably provide structural strength of the package body 110, and may be formed of a conductive material and electrically connected to the light emitting device, but is not limited thereto.

For example, the first frame 111, the second frame 112, and the third frame 153 may include one material selected at least one of the group including Cu, Ag, Au, Pt, or an alloy thereof.

In this case, the first frame 111 and the second frame 112 may be directly supplied with power from an electrode of a separate circuit board, and the third frame 153 may not be directly supplied with power. Also, it may be referred to as an intermediate frame, a connecting frame, a bridge frame, or the like, and the plurality of light emitting devices are connected in series to enable the application of high power to realize high output light output (6V, 9V, 12V, etc.) When the power is directly applied to the third frame 153 which is an intermediate frame, a dimming function may also be implemented.

The embodiment may include a first light emitting device 120A disposed on the first resin part 131 and a second light emitting device 120B disposed on the second resin part 132. The first and second light emitting devices 120A and 120B may be disposed in the cavity C provided by the package body 110.

The first light emitting device 120A may include a first bonding part 121, a second bonding part 122, a light emitting structure 123, and a substrate 124. In addition, the second light emitting device 120B may include a third bonding part 121b, a fourth bonding part 122b, a light emitting structure 123, and a substrate 124.

As shown in FIG. 2, the first and second light emitting devices 120A and 120B may include the light emitting structure 123 disposed under the substrate 124. The first and second bonding parts 121 and 122 and the third and fourth bonding parts 121b and 122b may be disposed between the light emitting structure 123 and the package body 110, respectively.

The light emitting structure 123 may include a first conductivity type semiconductor layer, a second conductivity type semiconductor layer, an active layer disposed between the first conductivity type semiconductor layer and the second conductivity type semiconductor layer. The first and third bonding parts 121 and 121b may be electrically connected to the first conductivity type semiconductor layer. In addition, the second and fourth bonding parts 122 and 122b may be electrically connected to the second conductivity type semiconductor layer.

The light emitting structure 123 may be provided as a compound semiconductor. The light emitting structure 123 may be provided as, for example, a Group 2-6 or Group 3-5 compound semiconductor. For example, the light emitting structure 123 may include at least two elements selected from aluminum (Al), gallium (Ga), indium (In), phosphorus (P), arsenic (As), and nitrogen (N).

The light emitting structure 123 may include a first conductivity type semiconductor layer, an active layer, and a second conductivity type semiconductor layer.

The first and second conductivity-type semiconductor layers may be implemented as at least one of a compound semiconductor of Groups 3-5 or 2-6. The first and second conductivity-type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity-type semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, Te, or the like. The second conductivity type semiconductor layer may be a p-type semiconductor layer doped with p-type dopants such as Mg, Zn, Ca, Sr, and Ba.

The active layer may be implemented with a compound semiconductor. The active layer may be implemented as at least one of a compound semiconductor of Group 3-Group 5 or Group 2-6, for example. When the active layer is implemented in a multi-well structure, the active layer may include a plurality of well layers and a plurality of barrier layers that are alternately arranged, and $In_xAl_yGa_{1-x-y}N$ ($0 \leq x \leq 1$, $0 \leq y \leq 1$, $0 \leq x+y \leq 1$). For example, the active layer is selected at least one from the group consisting of InGaN/

GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs.

The first bonding part 121 and the second bonding part 122 may be spaced apart from each other on the lower surface of the first light emitting device 120A. In addition, the third bonding part 121b and the fourth bonding part 122b may be spaced apart from each other on the lower surface of the second light emitting device 120B.

The first bonding part 121 may be disposed on the first frame 111. The second bonding part 122 and the third bonding part 121b may be disposed on the third frame 153. The fourth bonding part 122b may be disposed on the second frame 112.

The first to fourth bonding parts 121, 122, 121b, and 122b can be a single layer or multiple layers using one or more materials or alloys selected from the group consisting of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO.

One of the technical problems to be solved of the embodiment is to provide a light emitting device package, a method of manufacturing the same, and a lighting device including the same, which can solve the problem of electrical and physical reliability in the bonding area between the electrode of the package body and the electrode of the light emitting device.

In order to solve this problem, as shown in FIG. 2, the light emitting device package 100 may include an opening in each frame, and a conductive layer may be disposed in the opening.

For example, in an embodiment, the first frame 111 includes a first opening TH1, and the third frame 153 includes a second opening TH2 and a third opening TH3. The second frame 112 may include a fourth opening TH4, and the first to fourth conductive layers 321, 322, 323, and 324 are respectively formed in the first to fourth openings TH1, TH2, TH3, and TH4.

Through this, according to the embodiment, it is possible to provide a light emitting device package having an excellent electrical and physical reliability in the bonding region between the electrode of the package body and the electrode of the light emitting device, a manufacturing method thereof and a lighting device including the same.

For example, according to the light emitting device package and the manufacturing method for the light emitting device according to the embodiment, the re-melting phenomenon can be prevented from occurring in the bonding region of the light emitting device package while the light emitting device package is rebonded to the substrate or the like.

Specifically, a high temperature process such as a reflow may be applied when the conventional light emitting device package is mounted on a sub-mount or a circuit board.

At this time, in the reflow process, a re-melting phenomenon may occur in a bonding region between the lead frame provided in the light emitting device package and the electrode of the light emitting device, thereby reducing the stability of the electrical connection and the physical coupling. The position of the light emitting device may change, so that the optical and electrical properties and reliability of the light emitting device package may be degraded.

Accordingly, according to the light emitting device package and the manufacturing method for the light emitting device package according to the embodiment, the first frame 111 includes a first opening TH1, the third frame 153 includes a second opening TH2, and a third opening TH3, and the second frame 112 may include a fourth opening TH4, and each of the first to fourth conductive layers 321, 322, 323, and 324 is disposed in each of the first to fourth openings TH1, TH2, TH3, and TH4. The first to fourth bonding parts 121, 122, 121b, and 122b of the light emitting device according to the embodiment may include the first to fourth openings TH1, TH2, TH3, and the like. The driving power may be provided through the first to fourth conductive layers 321, 322, 323, and 324 disposed on each of the first to fourth openings TH1, TH2, TH3, and TH4.

Accordingly, the first and second light emitting devices 120A and 120B contact not only the first to third frames 111, 112, and 153 of the package body 110, but also the first to fourth openings TH1, TH2, TH3, and TH4, respectively. The remelting problem may be prevented by bonding the first to fourth conductive layers 321, 322, 323, and 324. Further, in an embodiment, the melting point of the conductive layer disposed in the opening may be selected to have a higher value than the melting point of the general bonding material.

In addition, the adhesive material between the first and second light emitting devices 120A and 120B and the package body 110 and the adhesive material between the light emitting device package and the circuit board are different from each other to be remelted.

Therefore, the light emitting device package 100 according to the embodiment does not cause re-melting even when bonded to a main substrate through a reflow process, so that electrical connection and physical bonding force are not reduced.

In addition, according to the light emitting device package 100 and the manufacturing method for the light emitting device package according to the embodiment, the package body 110 does not need to be exposed to high temperatures in the process of manufacturing the light emitting device package. Therefore, according to the embodiment, it is possible to prevent the package body 110 from being damaged or discolored due to exposure to high temperature.

In addition, in the embodiment, since the first resin part 131 disposed in the first recess R1 of the body 113 and the second resin part 132 disposed in the second recess R2 of the body 113 are positioned between the first and second light emitting devices 120A and 120B and the body 113 to form the body 113 and the first material, the coupling force between the first light emitting device 120A and the second light emitting device 120B may be increased.

Accordingly, in the embodiment, the first and second light emitting devices 120A and 120B contact not only the first to third frames 111, 112 and 153 of the package body 110, but also the first to fourth openings TH1, TH2, TH3, and TH4 of the respective frames. The first and second resin parts 131 and 132 are bonded to the first to fourth conductive layers 321, 322, 323, and 324, and the embodiment has a complex technical effect that can provide a stable fixing force between the first and second light emitting devices 120A, 120B and the package body 110.

Referring to FIG. 2, the first opening TH1 may be provided in the first frame 111.

The first opening TH1 may be provided through the first frame 111. The first opening TH1 may be provided through the upper and lower surfaces of the first frame 111 in the first direction.

The first opening TH1 may be disposed under the first bonding part 121 of the first light emitting device 120A. The first opening TH1 may be provided to overlap the first bonding part 121 of the first light emitting device 120A in a first direction from the top surface of the first frame 111 to the bottom surface thereof.

The second and third openings TH2 and TH3 may be provided in the third frame 153. The second and third openings TH2 and TH3 may be provided through the third frame 153. The second and third openings TH2 and TH3 may be provided through the upper and lower surfaces of the third frame 112 in the first direction.

The second opening TH2 may be disposed under the second bonding part 122 of the first light emitting device 120A. The third opening TH3 may be disposed under the third bonding part 121a of the second light emitting device 120B.

The fourth opening TH4 may be provided in the second frame 112. The fourth opening TH4 may be provided through the second frame 112. The fourth opening TH4 may be provided through the upper and lower surfaces of the second frame 112 in the first direction.

The fourth opening TH4 may be disposed under the fourth bonding part 122b of the second light emitting device 120B. The fourth opening TH4 may overlap the fourth bonding part 122b of the second light emitting device 120B in a first direction from the top surface of the second frame 112 to the bottom surface thereof.

The first opening TH1 and the second opening TH2 may be spaced apart from each other. The first opening TH1 and the second opening TH2 may be spaced apart from each other under a lower surface of the first light emitting device 120A.

In example embodiments, the width W1 of the upper region of the first opening TH1 may be smaller than or equal to the width of the first bonding part 121. In addition, the width of the upper region of the second opening TH2 may be smaller than or equal to the width of the second bonding portion 122.

Therefore, the first bonding portion 121 of the first light emitting device 120A contacts not only the first conductive layer 321 disposed in the first opening TH1, but also the first frame 111, thereby making it more firmly attached.

Similarly, the second bonding portion 122 of the first light emitting device 120A may contact not only the second conductive layer 322 disposed in the second opening TH2, but also the third frame 153, thereby making it more firmly attached.

In addition, the width W1 of the upper region of the first opening TH1 may be provided in several tens of micrometers to several hundred micrometers. In addition, the width W2 of the lower region of the first opening TH1 may be provided to be several tens of micrometers to several hundred micrometers larger than the width W1 of the upper region of the first opening TH1. Through this, the electrical reliability with the circuit board mounted on the lower side can be improved, and when the first conductive layer 321 is injected from the lower side, the conductive layer is not only smooth but also the conductive layer is uniformly formed, so reliability can be improved.

In addition, the width of the upper region of the second opening TH2 may be provided in several tens of micrometers to several hundred micrometers. In addition, the width of the lower region of the second opening TH2 may be provided to be several tens of micrometers to several hundred micrometers larger than the width of the upper region of the second opening TH2.

In addition, the width W2 of the lower region of the first opening TH1 may be wider than the width W1 of the upper region of the first opening TH1. The first opening TH1 may be provided in a predetermined width by a predetermined depth in the upper region, and may be provided in an inclined shape toward the lower region.

In addition, the width of the lower region of the second opening TH2 may be wider than the width of the upper region of the second opening TH2. The second opening TH2 may be provided in a predetermined width by a predetermined depth in the upper region, and may be provided in an inclined shape toward the lower region.

For example, the first opening TH1 may be provided in an inclined form in which the width gradually decreases from the lower region to the upper region. In addition, the second opening TH2 may be provided in an inclined form in which the width gradually decreases from the lower region to the upper region.

According to an embodiment, the lower regions of the first and second openings TH1 and TH2 may include inclined surfaces (not shown). However, the present invention is not limited thereto, and the inclined surfaces between the upper and lower regions of the first and second openings TH1 and TH2 may have a plurality of inclined surfaces having different inclinations, and the inclined surfaces may be disposed with curvature.

In addition, the width W3 between the first opening portion TH1 and the second opening portion TH2 may be provided in hundreds of micrometers in the lower region of the first frame 111 and the third frame 153. The width W3 between the first opening TH1 and the second opening TH2 in the lower region of the first frame 111 and the third frame 153 is, for example, 100 micrometers to 150 micrometers.

In the lower region of the first frame 111 and the third frame 153, the width W3 between the first opening TH1 and the second opening TH2 is a light emitting device package according to an embodiment. If light emitting device package 100 is later mounted on a circuit board, sub-mount, or the like, it may be selected to be provided over a certain distance to prevent electrical short between pads.

In an embodiment of FIG. 2, the depth T2 of the first to fourth openings TH1, TH2, TH3, and TH4 corresponds to the thicknesses of the first to third frames 111, 112, and 153. It may be provided, and may be provided in a thickness that can maintain a stable strength of the frame.

In addition, the depth T2 of the first to fourth openings TH1, TH2, TH3, and TH4 may be provided corresponding to the thickness of the body 113, and may be provided to have a thickness capable of maintaining a stable strength of the body.

For example, the depth T2 of the first opening TH1 may be provided at several hundred micrometers. The depth T2 of the first opening TH1 may be provided at 180 micrometers to 500 micrometers. For example, the depth T2 of the first opening TH1 may be provided as 500 micrometers.

For example, the thickness of the (T2-T1) may be selected to at least 100 micrometers or more. This is to consider the thickness of the injection process that can provide a crack free of the body 113.

According to an embodiment, the ratio of T1 thickness to T2 thickness (T2/T1) may be provided as 2 to 10. For example, if the thickness of T2 is provided at 200 micrometers, the thickness of T1 may be provided at 20 micrometers to 100 micrometers. When the ratio T2/T1 of the T1 thickness and the T2 thickness is 2 or more, mechanical strength may be secured so that cracks do not occur in the body 113 or are not disconnected. In addition, when the ratio T2/T1 of the thickness T1 to the thickness T2 is equal to or less than 10, the amount of the resin part 130 disposed in the recess may be sufficiently disposed. Therefore, the first and second light emitting devices 120A may be disposed. The fixing force between the 120B and the light emitting device package 110 may be improved.

Next, in the embodiment, first to fourth conductive layers 321, 322, 323, and 324 are disposed in the first to fourth openings TH1, TH2, TH3, and TH4, respectively, and the first to fourth openings TH1, TH2, and TH3, respectively. TH4 may overlap each other in the vertical direction with the first to fourth bonding parts 121, 122, 121*b*, and 122*b*.

In addition, the first to fourth conductive layers 321, 322, 323, and 324 may overlap each other in the vertical direction with the first to fourth bonding parts 121, 122, 121*b*, and 122*b*, respectively.

The width of the first to fourth conductive layers 321, 322, 323, and 324 may be provided smaller than the width of the first to fourth bonding portions 121, 122, 121*b*, and 122*b*.

The first to fourth conductive layers 321, 322, 323, and 324 may include at least one material selected from the group including Ag, Au, Pt, or an alloy thereof. However, the present invention is not limited thereto, and a material capable of securing a conductive function may be used as the first to fourth conductive layers 321, 322, 323, and 324.

For example, the first to fourth conductive layers 321, 322, 323, and 324 may be formed using a conductive paste. The conductive paste may include a solder paste, a silver paste, or the like, and may include a multilayer or a single layer composed of a multilayer or an alloy composed of different materials.

(Fifth Resin Part Under/Around Light Emitting Device)

The light emitting device package according to the embodiment includes a fifth resin part 135 below or around the first and second light emitting devices 120A and 120B, as shown in FIG. 2. Adhesion between 120A and 120B and the first to third frames 111, 112, and 153 may be improved, and the fifth resin part 135 may have the first and second light emitting devices 120A and 120B. When reflecting the light emitted from the light emitting device package 100 can improve the light extraction efficiency.

For example, the first frame 111 includes a third upper recess R3 provided on an upper surface thereof, and the second frame 112 is a fourth upper recess R4 provided on an upper surface thereof. The third frame 153 may include third and fourth upper recesses R3 and R4 provided on an upper surface thereof.

The third upper recess R3 may be concave in a lower surface direction on an upper surface of the first frame 111. The third upper recess R3 may be spaced apart from the first opening TH1 in the outward direction of the package body 110.

In addition, according to an embodiment, the side surface of the third upper recess R3 may have an inclined surface and may have a curvature. In addition, the third upper recess R3 may have a spherical shape, and the side surface may have a circular shape.

The fourth upper recess R4 may be provided on an upper surface of the third frame 153. The fourth upper recess R4 may be recessed in a lower surface direction on an upper surface of the third frame 153. In addition, according to an embodiment, the side surface of the fourth upper recess R4 may have an inclined surface and may have a curvature. In addition, the fourth upper recess R4 may have a spherical shape, and the side surface may have a circular shape.

In addition, the light emitting device package 100 according to the embodiment may include a fifth resin part 135 in the third and fourth upper recesses R3 and R4, as shown in FIG. 2. For example, the fifth resin part 135 may include at least one of an epoxy-based material, a silicon-based material, a hybrid material including an epoxy-based material and a silicon-based material.

The fifth resin part 135 may be disposed between the first to third frames 111, 112, and 153 and the first and second light emitting devices 120A and 120B. The fifth resin part 135 filled in the upper recess R3 and the fourth upper recess R4 may effectively seal the periphery of the first to fourth bonding parts 121, 122, 121*b* and 122*b*.

In addition, the fifth resin part 135 may be provided under the first and second light emitting devices 120A and 120B in the third upper recess R3 and the fourth upper recess R4, so it can provide enough space. The third upper recess R3 and the fourth upper recess R4 may provide an appropriate space in which a kind of under-fill process may be performed under the first light emitting device 120A.

Accordingly, the fifth resin part 135 filled in the third upper recess R3 and the fourth upper recess R4 is the first to fourth bonding parts 121, 122, 121*b* and 122*b* and it is possible to seal the surroundings effectively.

In addition, the embodiment of the present invention may include the first and second light emitting devices 120A, 120B, the first and second resin parts 131 and 132 disposed in the first and second recesses R1 and R2 of the body 113 and the package body 110. The fifth resin part 135 is disposed in the third and fourth upper recesses R3 and R4 to fix the first to fourth bonding parts 121, 122, 121*b* and 122*b* so that it has a technical effect of sealing the periphery.

In addition, in the embodiment, when the first and second recesses R3 and R4 are disposed to cover a partial area of the first to fourth bonding parts 121, 122, 121*b* and 122*b*, the first to second recesses may be disposed. By blocking the four conductive layers 121, 122, 123, and 124 from extending to the side surfaces of the first and second light emitting devices 120A and 120B, the electrical short circuit problem in the active layer may be more effectively improved.

In addition, the fifth resin part 135 may be disposed under the first and second light emitting devices 120A and 120B to perform a sealing function. In addition, the fifth resin part 135 may improve the adhesive force between the first and second light emitting devices 120A and 120B and the first to third frames 111, 112, and 153.

In addition, when the fifth resin part 135 is formed of white silicon so as to reflect the light emitted from the first and second light emitting devices 120A and 120B, or includes a material having a reflective property such as TiO2. The fifth resin part 135 reflects the light provided from the first and second light emitting devices 120A and 120B in the upper direction of the package body 110 to extract light efficiency of the light emitting device package 100.

In addition, when the fifth resin part 135 is disposed to fill the third and fourth upper recesses R3 and R4, as described above. Since a portion of the third and fourth upper recesses R3 and R4 surrounds a portion of the first and second light emitting devices 120A and 120B, the reflectance may be increased in a region where the third and fourth upper recesses R3 and R4 are disposed. Therefore, light extraction efficiency of the light emitting device package 100 may be improved.

<Molding Part>

Next, the light emitting device package 100 according to the embodiment may include a molding unit 140, as shown in FIG. 1. For reference, in FIG. 1, the molding part 140 is not shown so that the arrangement relationship between the first to third frames 111, 112, and 153 and the body 113 may be well represented.

The molding part 140 may be provided on the first and second light emitting devices 120A and 120B. The molding part 140 may be disposed on the first to third frames 111, 112, and 151. The molding part 140 may be disposed in the cavity C provided by the package body 110.

The molding part 140 may include an insulating material. In addition, the molding part 140 may include wavelength conversion means for receiving the light emitted from the first and second light emitting devices 120A and 120B and providing the wavelength-converted light. For example, the molding unit 140 may be at least one selected from the group including phosphors, quantum dots, and the like.

FIG. 3 is a conceptual diagram in which the light emitting device package illustrated in FIG. 1 is disposed on the circuit board 410.

The circuit board 410 may include a first pad 411, a second pad 412, and a substrate 415. A power supply circuit may be provided on the substrate 415 to control driving of the first and second light emitting devices 120A and 120B. For example, the circuit board 410 may include a first wiring 413 and a second wiring 414, and the first wiring 413 may be electrically connected to the first pad 411. The second wire 414 may be electrically connected to the second pad 412.

The first pad 411 and the second pad 412 may include a conductive material. For example, the first pad 411 and the second pad 412 may be selected from a group including Ti, Cu, Ni, Au, Cr, Ta, Pt, Sn, Ag, P, Fe, Sn, Zn, and Al. It may comprise at least one material selected or alloys thereof. The first pad 411 and the second pad 412 may be provided in a single layer or multiple layers.

As illustrated in FIG. 3, the light emitting device package 100 may be disposed on the circuit board 410. The first pad 411 and the first bonding part 121 may be electrically connected to each other, and the second pad 412 and the fourth bonding part 122 may be electrically connected to each other.

FIGS. 1 and 3, the first light emitting device 120A and the second light emitting device 120B may be electrically connected in series, and through this, a high output series method of a flip chip (6V, 9V, 12V, etc.), and the resin part may serve as an adhesive and provide a light emitting device package having high reliability while providing a high output by a conductive layer disposed in the opening.

For example, the first frame 111 and the second frame 112 may be directly supplied with power from an electrode of a separate circuit board, and the third frame 153 may not be directly supplied with power. In addition, the plurality of light emitting devices are connected in series, so that high power can be applied (6V, 9V, 12V, etc.). In addition, when power is directly applied to the third frame 153 which is an intermediate frame, a dimming function may be implemented.

Meanwhile, the above-described light emitting device package may be provided with, for example, a flip chip light emitting device. For example, the flip chip light emitting device may be provided as a transmissive flip chip light emitting device in which light is emitted in six plane directions, or may be provided as a reflective flip chip light emitting device in which light is emitted in a five plane direction.

The reflective flip chip light emitting device in which light is emitted in the five surface directions may have a structure in which a reflective layer is disposed in a direction close to the package body 110. For example, the reflective flip chip light emitting device may include an insulating reflective layer (eg, Distributed Bragg Reflector, Omni Directional Reflector, etc.) and/or a conductive reflective layer (eg, Ag, Al, Ni, Au, etc.) between the first and second bonding portions and the light emitting structure.

In addition, the flip-chip light emitting device for emitting light in the six plane direction has a first bonding portion electrically connected to the first conductivity type semiconductor layer, a second bonding portion electrically connected to the second conductivity type semiconductor layer, the light emitting device may be provided as a general horizontal light emitting device that emits light between the first bonding portion and the second bonding portion.

In addition, the flip chip light emitting device for emitting light in the six-plane direction is a transmissive flip chip light emitting device including both a reflecting region disposed between the first and second bonding portion and a light transmitting region.

Here, the transmissive flip chip light emitting device refers to a device in which light is emitted to the top surface, four sides, and six surfaces of the bottom surface. In addition, the reflective flip chip light emitting device refers to a device that emits light to the top surface, five surfaces of four sides.

On the other hand, the light emitting device package 100 according to the embodiment described above may be mounted and supplied to a sub-mount or a circuit board.

However, in the conventional light emitting device package is mounted on a sub-mount or a circuit board, a high temperature process such as a reflow may be applied. At this time, in the reflow process, a re-melting phenomenon occurs in the bonding region between the lead frame and the light emitting device provided in the light emitting device package, thereby weakening the stability of the electrical connection and the physical coupling.

However, according to the light emitting device package and the manufacturing method for the light emitting device package according to the embodiment, the first to the bonding portion of the light emitting device according to the embodiment may be provided with the driving power through the conductive layer disposed in the opening. And, the melting point of the conductive layer disposed in the opening may be selected to have a higher value than the melting point of the general bonding material.

Accordingly, the light emitting device package 100 according to the embodiment does not cause remelting even when bonded to a main substrate through a reflow process, so that electrical connection and physical bonding force are not degraded.

In addition, according to the light emitting device package 100 and the manufacturing method for the light emitting device package according to the embodiment, the package body 110 does not need to be exposed to high temperatures in the process of manufacturing the light emitting device package. Therefore, according to the embodiment, it is possible to prevent the package body 110 from being damaged or discolored due to exposure to high temperature.

Second Embodiment

FIG. 4 is a plan view of a light emitting device package 102 according to the second embodiment.

One of the technical problems to be solved of the embodiment is to provide a light emitting device package having a high output while having high reliability and a compact semiconductor package, a manufacturing method thereof, and a lighting device including the same.

The second embodiment can employ the technical features of the first embodiment. For example, the second embodiment may include a package body 110 and a plurality of light emitting devices disposed on the package body 110 to implement a high output light output. For example, the embodiment may include the first light emitting device 120A and the second light emitting device 120B, but the present invention is not limited thereto, and three or more light emitting devices may be provided to implement a high output light output.

The package body 110 may include a plurality of frames. For example, the package body 110 may include a first frame 111A, a second frame 112A, and a third frame 153 spaced apart from each other.

In this case, the first frame 111A and the second frame 112A may be directly powered from an electrode of a separate circuit board, and the third frame 153 may not be directly powered. When the plurality of light emitting devices are connected in series, high power can be applied to implement a high-power optical output, and a dimming function can also be implemented when power is directly applied to the third frame 153 which is an intermediate frame.

In addition, the package body 110 may include a body —113 that functions as a supporting part, and includes a resin part 130 in an upper region overlapping the first light emitting device 120A and the second light emitting device 120B. For example, the embodiment may include a resin part —130, for example, a first resin part —131 and a second resin part 132 in an upper region overlapping the first light emitting device 120A and the second light emitting device 120B may be included, respectively, to improve bonding strength between the package body and the light emitting device.

In addition, the first resin part 131 and the second resin part 132 may extend to the outside of the first light emitting device 120A and the second light emitting device 120B, respectively. The electrical reliability can be improved by preventing the electrical short circuit by blocking the lateral expansion of paste.

In addition, the package body 110 may include a fifth resin part 135 around the first and second light emitting devices 120A and 120B. For example, the fifth resin part 135 may be disposed below and/or on the side surfaces of the first and second light emitting devices 120A and 120B to perform a sealing function. In addition, the fifth resin part 135 may improve adhesion between the first and second light emitting devices 120A and 120B and the first to third frames 111A, 112A, and 153.

As illustrated in FIG. 4, in the second embodiment, the first frame 111A and the second frame 112A may have a smaller size than the third frame 153. Through this, according to the embodiment, it is possible to provide a light emitting device package, a manufacturing method thereof, and a lighting device including the same, while providing high output and excellent reliability and compact semiconductor package size.

For example, the first frame 111A and the second frame 112A may be disposed to overlap each other up and down, and the third frame 153 may extend in the longitudinal direction of the first and second light emitting devices 120B. The first light emitting device 120A is disposed on the first frame 111A and the third frame 153 so as to be perpendicular to the second light emitting device 120A, and the second light emitting device 120B is disposed on the second frame 112A. By arranging on the third frame 153, it is possible to provide a light emitting device package having high output while having high reliability and having a compact semiconductor package size.

The first light emitting device 120A and the second light emitting device 120B are disposed to overlap the upper and lower parts as a whole, so that the area occupied by the light emitting devices 120A and 120B and the light emitting device package body 110 can be very compact. Accordingly, according to the embodiment, it is possible to provide a light emitting device package, a manufacturing method thereof, and a lighting device including the same, which provide high power and excellent reliability and have a compact semiconductor package size.

In addition, according to the embodiment, a light emitting device package including a first resin part 131, a second resin part 132, respectively, to improve the bonding strength between the package body and the light emitting device, a manufacturing method thereof and a lighting device including the same can be provided.

In addition, according to the embodiment, it is possible to provide a light emitting device package having an excellent electrical and physical reliability in the bonding region between the electrode of the package body and the electrode of the light emitting device, a manufacturing method thereof and a lighting device including the same.

In addition, according to the embodiment, it is possible to provide a light emitting device package, a manufacturing method thereof and a lighting device including the same, which can improve the brightness by the resin unit.

In addition, according to the embodiment, there is a combined effect of providing a light emitting device package, a manufacturing method thereof, and a lighting device including the same, which can reduce manufacturing cost and improve manufacturing yield by improving process efficiency and changing a structure.

Third Embodiment

FIG. 5 is a plan view of a light emitting device package 103 according to the third embodiment.

One of the technical problems to be solved of the embodiment is to provide a light emitting device package having a high output while having high reliability and a compact semiconductor package, a manufacturing method thereof, and a lighting device including the same.

The third embodiment can adopt the technical features of the first embodiment and the second embodiment.

For example, the third embodiment may include a package body 110 and a plurality of light emitting devices disposed on the package body 110 to implement a high output light output. For example, the embodiment may include the first light emitting device 120A, the second light emitting device 120B, and the third light emitting device 120C, but is not limited thereto.

The package body 110 may include a plurality of frames. For example, the package body 110 may include a first frame 111A, a second frame 112A, a third frame 153, and a fourth frame 154 spaced apart from each other, but are not limited thereto, and may include five or more frames.

In this case, the first frame 111A and the second frame 112A may be directly supplied with power from an electrode of a separate circuit board, and the third frame 153 and the fourth frame 154 may be directly Power may not be applied, and the plurality of light emitting devices are connected in series to enable high power to be applied, thereby realizing high power optical output, and the third frame 153 or the fourth frame 154 as an intermediate frame. Dimming can also be implemented when power is applied directly.

In addition, the package body 110 may include a body 113 functioning as a supporting part, and an upper region overlapping the first light emitting device 120A, the second light emitting device 120B, and the third light emitting device 120C. Each of the first to third resin parts 131, 132, and 133 may be included in the package body to improve bonding strength between the package body and the light emitting device.

In addition, the first to third resin parts 131, 132, and 133 may extend to the outside of the first light emitting device 120A, the second light emitting device 120B, and the third light emitting device 120C, respectively. The electrical reliability can be improved by preventing the electrical short circuit by blocking the lateral expansion of the paste.

In addition, the package body 110 may include a fifth resin part 135 around the first, second, and third light emitting devices 120A, 120B, and 120C. For example, the fifth resin part 135 may be disposed under and/or side surfaces of the first, second, and third light emitting devices 120A, 120B, and 120C to perform a sealing function. In addition, the fifth resin part 135 may improve adhesion between the first, second, and third light emitting devices 120A, 120B, and 120C and the first to fourth frames 111A, 112A, 153, and 154.

In the third embodiment, a fourth frame 154 spaced apart from the third frame 153 and the second frame 112A is disposed between the third frame 153 and the second frame 112A.

The first light emitting device 120A may be disposed on the first frame 111A and the third frame 153, and the second light emitting device 120B may be the second frame 112A and the fourth frame 154. And the third light emitting device 120C may be disposed on the third frame 153 and the fourth frame 154.

As shown in FIG. 5, in the third embodiment, the first frame 111A and the second frame 112A may have a smaller size than the third frame 153 and the fourth frame 154. Through this, according to the embodiment, it is possible to provide a light emitting device package, a manufacturing method thereof, and a lighting device including the same, while providing high output and excellent reliability and compact semiconductor package size.

For example, the first frame 111A and the second frame 112A may be disposed adjacent to the side, and the third frame 153 may be arranged to overlap between the top and bottom of the first frame 111A and the second frame 112A.

In addition, the fourth frame 154 is disposed perpendicular to the lengthwise direction of the second and third light emitting devices 120B and 120C, thereby providing a high output while providing high reliability and a compact semiconductor package size.

Since the second light emitting device 120B and the third light emitting device 120C are disposed to overlap each other, the area occupied by the light emitting devices 120A, 120B, and 120C and the light emitting device package body 110 is extremely compact. In addition, it is possible to implement a high power light emitting device package. According to the embodiment, it is possible to provide a light emitting device package, a manufacturing method thereof, and a lighting device including the same, which provides high power and excellent reliability and a compact semiconductor package size.

In addition, according to the embodiment, a light emitting device package including a first resin part 131, a second resin part 132, and a third resin part 133, respectively, to improve the bonding coupling force between the package body and the light emitting device. It is possible to provide a manufacturing method thereof and a lighting device including the same.

In addition, according to the embodiment, it is possible to provide a light emitting device package having an excellent electrical and physical reliability in the bonding region between the electrode of the package body and the electrode of the light emitting device, a manufacturing method thereof and a lighting device including the same.

In addition, according to the embodiment, it is possible to provide a light emitting device package, a manufacturing method thereof and a lighting device including the same, which can improve the brightness by the resin part.

In addition, according to the embodiment, there is a combined effect of providing a light emitting device package, a manufacturing method thereof, and a lighting device including the same, which can reduce manufacturing cost and improve manufacturing yield by improving process efficiency and changing a structure.

Fourth Example

FIG. 6 is a plan view of a light emitting device package 104 according to the fourth embodiment.

One of the technical problems to be solved of the embodiment is to provide a light emitting device package having a high output while having high reliability and a compact semiconductor package, a manufacturing method thereof, and a lighting device including the same.

The fourth embodiment can employ the technical features of the first to third embodiments.

For example, the fourth embodiment may include a package body 110 and a plurality of light emitting devices disposed on the package body 110 to implement high output light output. For example, the embodiment may include the first light emitting device 120A, the second light emitting device 120B, and the third light emitting device 120C, but is not limited thereto.

The package body 110 may include a plurality of frames. For example, the package body 110 may include a first frame 111A, a second frame 112A, a third frame 153, and a fourth frame 154 spaced apart from each other, but are not limited thereto, and may include five or more frames.

In this case, the first frame 111A and the second frame 112A may be directly supplied with power from an electrode of a separate circuit board, and the third frame 153 and the fourth frame 154 may be directly Power may not be applied, and the plurality of light emitting devices are connected in series to enable high power to be applied, thereby realizing high power optical output, and the third frame 153 or the fourth frame 154 as an intermediate frame. Dimming can also be implemented when power is applied directly.

In addition, the package body 110 may include a fifth resin part 135 around the first, second, and third light emitting devices 120A, 120B, and 120C. For example, the fifth resin part 135 may be disposed under and/or side surfaces of the first, second, and third light emitting devices 120A, 120B, and 120C to perform a sealing function. In addition, the fifth resin part 135 may improve adhesion between the first, second, and third light emitting devices 120A, 120B, and 120C and the first to fourth frames 111A, 112A, 153, and 154.

In addition, the package body 110 may include a body 113 functioning as a supporting part, and an upper region overlapping the first light emitting device 120A, the second light emitting device 120B, and the third light emitting device 120C. Each of the first to third resin parts 131, 132, and 133 may be included to improve bonding force between the package body and the light emitting device.

In addition, the first to third resin parts 131, 132, and 133 may extend to the outside of the first light emitting device 120A, the second light emitting device 120B, and the third light emitting device 120C, respectively. It can improve the electrical reliability by preventing the electrical short circuit by blocking the lateral expansion of paste, etc. during bonding.

In the third embodiment, a fourth frame 154 spaced apart from the third frame 153 and the second frame 112A is disposed between the third frame 153 and the second frame 112A.

The first light emitting device 120A may be disposed on the first frame 111A and the third frame 153, and the second light emitting device 120B may be the second frame 112A and the fourth frame 154. And the third light emitting device 120C may be disposed on the third frame 153 and the fourth frame 154.

As shown in FIG. 5, in the third embodiment, the first frame 111A and the second frame 112A may have a smaller size than the third frame 153 and the fourth frame 154. Through this, according to the embodiment, it is possible to provide a light emitting device package, a manufacturing method thereof, and a lighting device including the same, while providing high output and excellent reliability and compact semiconductor package size.

For example, the first frame 111A and the second frame 112A may be spaced apart from each other, and the third frame 153 and the fourth frame 154 may be disposed therebetween.

For example, the third frame 153 is disposed in a direction perpendicular to the longitudinal direction of the first light emitting device 120A, and the fourth frame 154 partially overlaps with the third frame 153. The first light emitting device 120A may be disposed in a direction perpendicular to the longitudinal direction, and may overlap with the second frame 112A.

As a result, since the arrangement of the light emitting devices and the arrangement of the frames are made dense, a light emitting device package having high reliability while providing high output and a compact semiconductor package size can be provided.

In particular, the first, second, and third light emitting devices 120A, 120B, and 120C are disposed to overlap side-to-side as a whole, thereby greatly occupying an area occupied by the light emitting devices 120A, 120B, and 120C and the light emitting device package body 110. It is possible to realize a compact and high power light emitting device package. Accordingly, according to the embodiment, it is possible to provide a light emitting device package, a manufacturing method thereof, and a lighting device including the same, which provide high power and excellent reliability and have a compact semiconductor package size.

In addition, according to the embodiment, it is possible to provide a light emitting device package having an excellent electrical and physical reliability in the bonding region between the electrode of the package body and the electrode of the light emitting device, a manufacturing method thereof and a lighting device including the same.

In addition, according to the embodiment, it is possible to provide a light emitting device package, a manufacturing method thereof and a lighting device including the same, which can improve the brightness by the resin unit.

In addition, according to the embodiment, a light emitting device package including a first resin part 131, a second resin part 132, and a third resin part 133, respectively, to improve the bonding coupling force between the package body and the light emitting device. It is possible to provide a manufacturing method thereof and a lighting device including the same.

In addition, according to the embodiment, there is a combined effect of providing a light emitting device package, a manufacturing method thereof, and a lighting device including the same, which can reduce manufacturing cost and improve manufacturing yield by improving process efficiency and changing a structure.

<Example of Flip Chip Light Emitting Device Applied to Light Emitting Device Package>

Next, an example of the flip chip light emitting device applied to the light emitting device package according to the embodiment will be described.

First, a light emitting device according to an embodiment will be described with reference to FIGS. 7 and 8.

FIG. 7 is a plan view illustrating a light emitting device according to the embodiment, and FIG. 8 is a cross-sectional view taken along line A-A of the light emitting device shown in FIG. 7.

Meanwhile, for clarity, in FIG. 7, the first sub-electrode is disposed under the first bonding part 1171 and the second bonding part 1172, but is electrically connected to the first bonding part 1171. The second sub-electrode 1142 electrically connected to the first sub-electrode 1141 and the second bonding part 1172 is illustrated.

The light emitting device 1100 according to the embodiment may include a semiconductor structure 1110 disposed on the substrate 1105.

The substrate 1105 may be selected from the group consisting of sapphire substrate (Al2O3), SiC, GaAs, GaN, ZnO, Si, GaP, InP, Ge. For example, the substrate 1105 may be provided as a patterned sapphire substrate (PSS) having an uneven pattern formed on an upper surface thereof.

The semiconductor structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

In example embodiments, the first conductivity type semiconductor layer 1111 may be provided as an n-type semiconductor layer, and the second conductivity type semiconductor layer 1113 may be provided as a p-type semiconductor layer. Of course, according to another embodiment, the first conductivity type semiconductor layer 1111 may be provided as a p-type semiconductor layer, and the second conductivity type semiconductor layer 1113 may be provided as an n-type semiconductor layer.

Hereinafter, for convenience of description, the first conductivity type semiconductor layer 1111 is provided as an n-type semiconductor layer and the second conductivity type semiconductor layer 1113 is provided as a p-type semiconductor layer.

The light emitting device 1100 according to the embodiment may include an ohmic contact layer 1130, as shown in FIG. 8. The ohmic contact layer 1130 may increase light output by improving current spreading. An arrangement position and a shape of the ohmic contact layer 1130 will be further described with reference to a method of manufacturing a light emitting device according to an embodiment.

For example, the ohmic contact layer 1130 may include at least one selected from the group consisting of metals, metal oxides, and metal nitrides. The ohmic contact layer 1130 may include a light transmissive material.

The ohmic contact layer 1130 may be formed of, for example, at least one selected from the group consisting of indium tin oxide (ITO), indium zinc oxide (IZO), indium zinc oxide (IZO), indium zinc tin oxide (IZTO), indium aluminum zinc oxide (IZAO), or IGZO, indium gallium zinc oxide (IGTO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni, IrOx/Au/ITO, Pt, Ni, Au, Rh, Pd.

The light emitting device 1100 according to the embodiment may include a reflective layer 1160, as shown in FIGS. 7 and 8. The reflective layer 1160 may include a first reflective layer 1161, a second reflective layer 1162, and a third reflective layer 1163. The reflective layer 1160 may be disposed on the ohmic contact layer 1130.

The second reflective layer 1162 may include a first opening h1 exposing the ohmic contact layer 1130. The second reflective layer 1162 may include a plurality of first openings h1 disposed on the ohmic contact layer 1130.

The first reflective layer 1161 may include a plurality of second openings h2 exposing upper surfaces of the first conductivity type semiconductor layers 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed in direct physical contact with the first reflective layer 1161 and the second reflective layer 1162.

For example, the width W5 of the third reflective layer 1163 may be provided smaller than the width W4 of the first recess R described with reference to FIG. 2.

Accordingly, light emitted between the first reflective layer 1161 and the third reflective layer 1163 may be incident on the first resin part 131 disposed in the first recess R area. Light emitted in a lower direction of the light emitting device may be diffused by the first resin part 131, and light extraction efficiency may be improved.

In addition, light emitted between the second reflective layer 1162 and the third reflective layer 1163 may be incident on the first resin part 131 disposed in the first recess R1. Light emitted in a lower direction of the light emitting device may be diffused by the first resin part 131, and light extraction efficiency may be improved.

The reflective layer 1160 may contact the second conductivity type semiconductor layer 1113 through a plurality of contact holes provided in the ohmic contact layer 1130. The reflective layer 1160 may be in physical contact with the upper surface of the second conductivity type semiconductor layer 1113 through a plurality of contact holes provided in the ohmic contact layer 1130.

The shape of the ohmic contact layer 1130 and the shape of the reflective layer 1160 according to the embodiment will be further described with reference to the method of manufacturing the light emitting device according to the embodiment.

The reflective layer 1160 may be provided as an insulating reflective layer. For example, the reflective layer 1160 may be provided as a distributed bragg reflector (DBR) layer. In addition, the reflective layer 1160 may be provided as an omni directional reflector (ODR) layer. In addition, the reflective layer 1160 may be provided by stacking a DBR layer and an ODR layer.

The light emitting device 1100 according to the exemplary embodiment may include a first sub-electrode 1141 and a second sub-electrode 1142 as shown in FIGS. 7 and 8.

The first sub-electrode 1141 may be electrically connected to the first conductivity-type semiconductor layer 1111 in the second opening h2. The first sub-electrode 1141 may be disposed on the first conductivity type semiconductor layer 1111. For example, according to the light emitting device 1100 according to the exemplary embodiment, the first sub-electrode 1141 may pass through the second conductivity type semiconductor layer 1113 and the active layer 1112 to form a first conductivity type semiconductor layer. The first conductivity type semiconductor layer 1111 may be disposed on the top surface of the first conductivity type semiconductor layer 1111 in a recess disposed up to a portion of the region 1111.

The first sub-electrode 1141 may be electrically connected to an upper surface of the first conductivity-type semiconductor layer 1111 through a second opening h2 provided in the first reflective layer 1161. The second opening h2 and the recess may vertically overlap each other. For example, as illustrated in FIGS. 7 and 8, the first sub-electrode 1141 may be formed in the plurality of recess regions. The upper surface of the first conductivity type semiconductor layer 1111 may be directly in contact with the upper surface of the first conductivity type semiconductor layer 1111.

The second sub-electrode 1142 may be electrically connected to the second conductivity type semiconductor layer 1113. The second sub-electrodes 1142 may be disposed on the second conductivity type semiconductor layer 1113. In example embodiments, the ohmic contact layer 1130 may be disposed between the second sub-electrode 1142 and the second conductivity type semiconductor layer 1113.

The second sub-electrode 1142 may be electrically connected to the second conductivity type semiconductor layer 1113 through a first opening h1 provided in the second reflective layer 1162. For example, as shown in FIGS. 7 and 8, the second sub-electrode 1142 may be electrically connected to the second conductivity type semiconductor layer 1113 through the ohmic contact layer 1130 in a plurality of P regions.

As shown in FIGS. 7 and 8, the second sub-electrode 1142 may pass through the ohmic contact layer through a plurality of first openings h1 provided in the second reflective layer 1162 in a plurality of P regions. 1130 may be in direct contact with the top surface.

According to an embodiment, as shown in FIGS. 7 and 8, the first sub-electrode 1141 and the second sub-electrode 1142 may be polarized to each other and may be spaced apart from each other.

For example, the first sub-electrode 1141 may be provided in a plurality of line shapes. In addition, the second sub-electrodes 1142 may be provided in a plurality of line shapes, for example. The first sub-electrode 1141 may be disposed between a plurality of neighboring second sub-electrodes 1142. The second sub-electrodes 1142 may be disposed between the plurality of adjacent first sub-electrodes 1141.

When the first sub-electrode 1141 and the second sub-electrode 1142 are configured with different polarities, they may be arranged with different numbers of electrodes. For example, when the first sub-electrode 1141 is an n-electrode and the second sub-electrode 1142 is a p-electrode, the number of the second sub-electrodes 1142 is greater than the first sub-electrode 1141. Can be more. When the electrical conductivity and/or resistance of the second conductivity type semiconductor layer 1113 and the first conductivity type semiconductor layer 1111 are different from each other, the first sub-electrode 1141 and the second sub-electrode 1142 are different. As a result, electrons and holes injected into the semiconductor structure 1110 may be balanced, and thus optical characteristics of the light emitting device may be improved.

The first sub-electrode 1141 and the second sub-electrode 1142 may be formed in a single layer or a multilayer structure. For example, the first sub-electrode 1141 and the second sub-electrode 1142 may be ohmic electrodes. For example, the first sub-electrode 1141 and the second sub-electrode 1142 may include At least one of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, Hf, or an alloy of two or more of these materials.

The light emitting device 1100 according to the embodiment may include a protective layer 1150, as shown in FIGS. 7 and 8.

The protective layer 1150 may include a plurality of third openings h3 exposing the second sub-electrodes 1142. The plurality of third openings h3 may be disposed to correspond to the plurality of PB regions provided in the second sub-electrodes 1142.

In addition, the protective layer 1150 may include a plurality of fourth openings h4 exposing the first sub-electrodes 1141. The plurality of fourth openings h4 may be disposed to correspond to the plurality of NB regions provided in the first sub-electrode 1141.

The protective layer 1150 may be disposed on the reflective layer 1160. The protective layer 1150 may be disposed on the first reflective layer 1161, the second reflective layer 1162, and the third reflective layer 1163.

For example, the protective layer 1150 may be provided as an insulating material.

For example, the protective layer 1150 may be formed of at least one material selected from the group consisting of SixOy, SiOxNy, SixNy, and AlxOy.

As illustrated in FIGS. 7 and 8, the light emitting device 1100 may include a first bonding part 1171 and a second bonding part 1172 disposed on the protective layer 1150.

The first bonding part 1171 may be disposed on the first reflective layer 1161. In addition, the second bonding part 1172 may be disposed on the second reflective layer 1162. The second bonding part 1172 may be spaced apart from the first bonding part 1171.

The first bonding part 1171 may be in contact with the top surface of the first sub-electrode 1141 through the plurality of fourth openings h4 provided in the protective layer 1150 in the plurality of NB regions. The plurality of NB regions may be disposed to be vertically shifted from the second opening h2. When the plurality of NB regions and the second opening h2 are vertically shifted from each other, the current injected into the first bonding part 1171 may spread evenly in the horizontal direction of the first sub-electrode 1141. Therefore, the current can be evenly injected in the plurality of NB regions.

In addition, the second bonding part 1172 may be in contact with the top surface of the second sub-electrode 1142 through the plurality of third openings h3 provided in the protective layer 1150 in the plurality of PB regions. When the plurality of PB regions and the plurality of first openings h1 are not vertically overlapped, the current injected into the second bonding portion 1172 may be spread evenly in the horizontal direction of the second sub-electrode 1142. Thus, current can be evenly injected in the plurality of PB regions.

As described above, according to the light emitting device 1100, the first bonding part 1171 and the first sub-electrode 1141 may be in contact with the fourth opening h4. In addition, the second bonding part 1172 and the second sub-electrode 1142 may be in contact with a plurality of regions. Accordingly, according to the embodiment, since power can be supplied through a plurality of regions, there is an advantage that the current dispersion effect can be generated and the operating voltage can be reduced by increasing the contact area and the dispersion of the contact region.

In addition, according to the light emitting device 1100 according to the embodiment, as shown in FIG. 8, the first reflective layer 1161 is disposed under the first sub-electrode 1141, and the second reflective layer 1162 is provided. The second sub electrode 1142 is disposed below the second sub electrode 1142. Accordingly, the first reflecting layer 1161 and the second reflecting layer 1162 reflect the light emitted from the active layer 1112 of the semiconductor structure 1110 and thus the first sub-electrode 1141 and the second sub-electrode. Light absorption may be minimized by minimizing light absorption at 1142.

For example, the first reflecting layer 1161 and the second reflecting layer 1162 may be made of an insulating material, and have a high reflectance material, for example, a DBR structure, for reflecting light emitted from the active layer 1112.

The first reflective layer 1161 and the second reflective layer 1162 may form a DBR structure in which materials having different refractive indices are repeatedly arranged with each other. For example, the first reflective layer 1161 and the second reflective layer 1162 may be disposed in a single layer or stacked structure including at least one of TiO2, SiO2, Ta2O5, and HfO2.

According to another embodiment, the present invention is not limited thereto, and the first reflective layer 1161 and the second reflective layer 1162 may emit light from the active layer 1112 according to the wavelength of light emitted from the active layer 1112. It can be chosen freely to adjust the reflectivity to light.

In another embodiment, the first reflective layer 1161 and the second reflective layer 1162 may be provided as an ODR layer. In another embodiment, the first reflective layer 1161 and the second reflective layer 1162 may be provided in a form of hybrid in which a DBR layer and an ODR layer are stacked.

When the light emitting device according to the embodiment is mounted in a flip chip bonding method and implemented as a light emitting device package, light provided from the semiconductor structure 1110 may be emitted through the substrate 1105. Light emitted from the semiconductor structure 1110 may be reflected by the first reflective layer 1161 and the second reflective layer 1162 and may be emitted toward the substrate 1105.

In addition, light emitted from the semiconductor structure 1110 may also be emitted in a lateral direction of the semiconductor structure 1110. In addition, the light emitted from the semiconductor structure 1110 may include the first bonding part 1171 and the second bonding among surfaces on which the first bonding part 1171 and the second bonding part 1172 are disposed. The portion 1172 may be discharged to the outside through the region where the portion 1172 is not provided.

In detail, the light emitted from the semiconductor structure 1110 may be formed of the first reflective layer 1161 and the second reflective layer 1162 among surfaces on which the first bonding portion 1171 and the second bonding portion 1172 are disposed. Light may be emitted to the outside through an area in which the third reflective layer 1163 is not provided.

Accordingly, the light emitting device 1100 according to the embodiment may emit light in six surface directions surrounding the semiconductor structure 1110 and may significantly improve the brightness.

Meanwhile, according to the light emitting device according to the embodiment, when viewed from the upper direction of the light emitting device 1100, the sum of the areas of the first bonding part 1171 and the second bonding part 1172 is the first bonding. It may be provided equal to or smaller than 60% of the total area of the upper surface of the light emitting device 1100 in which the unit 1171 and the second bonding unit 1172 are disposed.

For example, an entire area of the upper surface of the light emitting device 1100 may correspond to an area defined by the horizontal length and the vertical length of the lower surface of the first conductivity type semiconductor layer 1111 of the semiconductor structure 1110. In addition, the entire upper surface of the light emitting device 1100 may correspond to the area of the upper surface or the lower surface of the substrate 1105.

As such, the sum of the areas of the first bonding part 1171 and the second bonding part 1172 is provided to be equal to or smaller than 60% of the total area of the light emitting device 1100, thereby providing the first bonding. The amount of light emitted to the surface on which the portion 1171 and the second bonding portion 1172 are disposed may be increased. Accordingly, according to the embodiment, since the amount of light emitted in the six surface directions of the light emitting device 1100 increases, light extraction efficiency may be improved and light intensity Po may be increased.

In addition, when viewed from an upper direction of the light emitting device 1100, the sum of the area of the first bonding part 1171 and the area of the second bonding part 1172 is 30 of the total area of the light emitting device 1100. It may be provided equal to or greater than %.

As such, the sum of the areas of the first bonding part 1171 and the second bonding part 1172 is provided to be equal to or larger than 30% of the total area of the light emitting device 1100, thereby providing the first bonding. Stable mounting may be performed through the unit 1171 and the second bonding unit 1172, and may secure electrical characteristics of the light emitting device 1100.

In the light emitting device 1100 according to the embodiment, the sum of the areas of the first bonding part 1171 and the second bonding part 1172 may be at least 30% to 60% of the total area of the light emitting device 1100 in consideration of securing light extraction efficiency and bonding stability.

That is, when the sum of the areas of the first bonding part 1171 and the second bonding part 1172 is 30% or more and 100% or less of the total area of the light emitting device 1100, stable mounting may be performed by securing electrical characteristics and securing bonding strength to be mounted on the light emitting device package.

In addition, when the sum of the areas of the first bonding part 1171 and the second bonding part 1172 is greater than 0% and less than 60% of the total area of the light emitting device 1100, the first bonding part 1171 and the amount of light emitted to the surface on which the second bonding unit 1172 is disposed may increase the light extraction efficiency of the light emitting device 1100 and increase the light intensity Po.

In an embodiment, in order to secure the electrical characteristics of the light emitting device 1100 and the bonding force mounted on the light emitting device package and increase the brightness, the areas of the first bonding part 1171 and the second bonding part 1172 may be increased. The sum was selected to be 30% or more and 60% or less of the total area of the light emitting device 1100.

In addition, according to the light emitting device 1100 according to the embodiment, the third reflective layer 1163 may be disposed between the first bonding portion 1171 and the second bonding portion 1172. For example, the length W5 of the third reflective layer 1163 in the long axis direction of the light emitting device 1100 corresponds to the distance between the first bonding part 1171 and the second bonding part 1172. Can be arranged. In addition, an area of the third reflective layer 1163 may be, for example, 10% or more and 25% or less of the entire upper surface of the light emitting device 1100.

When the area of the third reflective layer 1163 is 10% or more of the entire upper surface of the light emitting device 1100, the package body disposed under the light emitting device may prevent discoloration or cracking, and when less than 25%, it is advantageous to ensure the light extraction efficiency to emit light to the six sides of the light emitting device.

In another embodiment, the area of the third reflective layer 1163 may be greater than 0% and less than 10% of the entire upper surface of the light emitting device 1100 in order to secure the light extraction efficiency. The area of the third reflective layer 1163 may be disposed to be greater than 25% to less than 100% of the entire upper surface of the light emitting device 1100 to prevent discoloration or cracking of the package body.

In addition, the semiconductor structure 1110 may be formed as a second region provided between the side surface disposed in the long axis direction of the light emitting device 1100 and the adjacent first bonding portion 1171 or the second bonding portion 1172. Light can be transmitted through and emitted.

In addition, light generated in the light emitting structure is provided to a third region provided between the side of the light emitting device 1100 disposed in the short axis direction and the adjacent first bonding part 1171 or the second bonding part 1172.

In example embodiments, the first reflective layer 1161 may have a size of several micrometers larger than that of the first bonding part 1171. For example, an area of the first reflective layer 1161 may be provided to a size sufficient to completely cover the area of the first bonding part 1171. In consideration of a process error, the length of one side of the first reflective layer 1161 may be provided to be, for example, about 4 micrometers to about 10 micrometers larger than the length of one side of the first bonding part 1171.

In addition, the size of the second reflective layer 1162 may be provided to be several micrometers larger than that of the second bonding part 1172. For example, an area of the second reflective layer 1162 may be provided to a size sufficient to completely cover an area of the second bonding part 1172. In consideration of the process error, the length of one side of the second reflective layer 1162 may be provided to be, for example, about 4 to 10 micrometers larger than the length of one side of the second bonding part 1172.

In example embodiments, light emitted from the semiconductor structure 1110 may be emitted from the first bonding portion 1171 and the second bonding portion 1172 by the first reflective layer 1161 and the second reflective layer 1162. Accordingly, according to the embodiment, the light generated and emitted from the semiconductor structure 1110 may be minimized by being incident on the first bonding part 1171 and the second bonding part 1172.

Further, according to the light emitting device 1100 according to the embodiment, since the third reflective layer 1163 is disposed between the first bonding portion 1171 and the second bonding portion 1172, the first bonding portion. The amount of light emitted between the 1171 and the second bonding part 1172 may be adjusted.

As described above, the light emitting device 1100 according to the embodiment may be mounted in a flip chip bonding method and provided in the form of a light emitting device package. In this case, when the package body in which the light emitting device 1100 is mounted is provided with a resin, the package body is discolored by the short wavelength strong light emitted from the light emitting device 1100 in the lower region of the light emitting device 1100 or cracking may occur.

However, according to the light emitting device 1100 according to the embodiment, since the amount of light emitted between the first bonding part 1171 and the second bonding part 1172 may be adjusted, the light emitting device 1100 may be adjusted. It is possible to prevent the package body disposed in the lower region of the discoloration or cracking.

In example embodiments, the semiconductor may be formed in an area of 20% or more of an upper surface of the light emitting device 1100 on which the first bonding part 1171, the second bonding part 1172, and the third reflective layer 1163 are disposed. Light generated in the structure 1110 may be transmitted through and emitted.

Accordingly, according to the embodiment, since the amount of light emitted in the six plane directions of the light emitting device 1100 increases, light extraction efficiency may be improved and light intensity Po may be increased. In addition, the package body disposed in close proximity to the lower surface of the light emitting device 1100 can be prevented from discoloration or cracking.

In addition, according to the light emitting device 1100 according to the embodiment, a plurality of contact holes C1, C2, and C3 may be provided in the ohmic contact layer 1130. The second conductivity-type semiconductor layer 1113 and the reflective layer 1160 may be bonded to each other through a plurality of contact holes C1, C2, and C3 provided in the ohmic contact layer 1130. Since the reflective layer 1160 may be in direct contact with the second conductivity type semiconductor layer 1113, the adhesive force may be improved as compared with the reflective layer 1160 being in contact with the ohmic contact layer 1130.

When the reflective layer 1160 directly contacts only the ohmic contact layer 1130, the bonding force or the adhesive force between the reflective layer 1160 and the ohmic contact layer 1130 may be weakened. For example, when the insulating layer and the metal layer are bonded, the bonding strength or adhesion between the materials may be weakened.

For example, when the bonding force or the adhesive force between the reflective layer 1160 and the ohmic contact layer 1130 is weak, peeling may occur between the two layers. As described above, when peeling occurs between the reflective layer 1160 and the ohmic contact layer 1130, characteristics of the light emitting device 1100 may be deteriorated, and reliability of the light emitting device 1100 may not be secured.

However, according to the embodiment, since the reflective layer 1160 may directly contact the second conductivity type semiconductor layer 1113, the reflective layer 1160, the ohmic contact layer 1130, and the second conductivity type semiconductor may be used. Bonding force and adhesion between layers 1113 can be provided stably.

Therefore, according to the embodiment, since the bonding force between the reflective layer 1160 and the second conductivity type semiconductor layer 1113 may be stably provided, the reflective layer 1160 may be separated from the ohmic contact layer 1130. In addition, since the bonding force between the reflective layer 1160 and the second conductivity type semiconductor layer 1113 may be stably provided, reliability of the light emitting device 1100 may be improved.

As described above, a plurality of contact holes C1, C2, and C3 may be provided in the ohmic contact layer 1130. Light emitted from the active layer 1112 may be incident to the reflective layer 1160 and reflected through the plurality of contact holes C1, C2, and C3 provided in the ohmic contact layer 1130. Accordingly, the light generated by the active layer 1112 may be reduced by being incident on the ohmic contact layer 1130 and the light extraction efficiency may be improved. Accordingly, according to the light emitting device 1100 according to the embodiment, the brightness may be improved.

Next, another example of the flip chip light emitting device applied to the light emitting device package according to the embodiment will be described with reference to the accompanying drawings.

First, a light emitting device according to an embodiment will be described with reference to FIGS. 9 and 10. FIG. 9 is a plan view illustrating an electrode arrangement of a light emitting device applied to a light emitting device package according to an embodiment, and FIG. 10 is a cross-sectional view taken along line F-F of the light emitting device shown in FIG. 9.

On the other hand, for the sake of understanding, in FIG. 9, only a relative arrangement relationship between the first electrode 127 and the second electrode 128 is conceptually illustrated. The first electrode 127 may include a first bonding part 121 and a first branch electrode 125. The second electrode 128 may include a second bonding part 122 and a second branch electrode 126.

Unlike the flip chip light emitting device of FIG. 7, the area of the first and second bonding parts 121 and 122 of the first light emitting device 120A and the light emitting structure 123 of the first light emitting device 120A are different, the ratio of the area of may be different. The light emitting device according to the embodiment may include a light emitting structure 123 disposed on the substrate 124, as shown in FIGS. 9 and 10.

The substrate 124 may be selected from the group including sapphire substrate (Al2 O3), SiC, GaAs, GaN, ZnO, Si, GaP, InP, Ge. For example, the substrate 124 may be provided as a patterned sapphire substrate (PSS) having an uneven pattern formed on an upper surface thereof.

The light emitting structure 123 may include a first conductivity type semiconductor layer 123a, an active layer 123b, and a second conductivity type semiconductor layer 123c. The active layer 123b may be disposed between the first conductivity type semiconductor layer 123a and the second conductivity type semiconductor layer 123c. For example, the active layer 123b may be disposed on the first conductivity type semiconductor layer 123a, and the second conductivity type semiconductor layer 123c may be disposed on the active layer 123b.

In example embodiments, the first conductivity-type semiconductor layer 123a may be provided as an n-type semiconductor layer, and the second conductivity-type semiconductor layer 123c may be provided as a p-type semiconductor layer. Of course, in another embodiment, the first conductivity type semiconductor layer 123a may be provided as a p-type semiconductor layer, and the second conductivity type semiconductor layer 123c may be provided as an n-type semiconductor layer.

The light emitting device according to the embodiment may include a first electrode 127 and a second electrode 128 as shown in FIGS. 9 and 10.

The first electrode 127 may include a first bonding part 121 and a first branch electrode 125. The first electrode 127 may be electrically connected to the second conductivity type semiconductor layer 123c. The first branch electrode 125 may be branched from the first bonding part 121. The first branch electrode 125 may include a plurality of branch electrodes branched from the first bonding part 121.

The second electrode 128 may include a second bonding part 122 and a second branch electrode 126. The second electrode 128 may be electrically connected to the first conductivity type semiconductor layer 123a. The second branch electrode 126 may be branched from the second bonding part 122. The second branch electrode 126 may include a plurality of branch electrodes branched from the second bonding part 122.

The first branch electrode 125 and the second branch electrode 126 may be alternately arranged in a finger shape. Power supplied through the first bonding portion 121 and the second bonding portion 122 by the first branch electrode 125 and the second branch electrode 126 to the entire light emitting structure 123.

The first electrode 127 and the second electrode 128 may be formed in a single layer or a multilayer structure. For example, the first electrode 127 and the second electrode 128 may be ohmic electrodes. For example, the first electrode 127 and the second electrode 128 may be at least one of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, Hf, or an alloy of two or more of these materials.

Meanwhile, a protective layer may be further provided on the light emitting structure 123. The protective layer may be provided on an upper surface of the light emitting structure 123. In addition, the protective layer may be provided on the side surface of the light emitting structure 123. The protective layer may be provided to expose the first bonding portion 121 and the second bonding portion 122. In addition, the protective layer may be selectively provided on the circumference and the lower surface of the substrate 124.

For example, the protective layer may be provided as an insulating material.

For example, the protective layer may be formed of at least one material selected from the group consisting of SixOy, SiOxNy, SixNy, and AlxOy.

In the light emitting device according to the embodiment, light generated in the active layer 123b may emit light in six planes of the light emitting device. Light generated by the active layer 123b may be emitted in six plane directions through the top, bottom, and four side surfaces of the light emitting device.

Light emitted to the upper surface of the light emitting device may be incident to the first and second recesses R1 and R2 described above.

For reference, the vertical placement direction of the light emitting device described with reference to FIG. 2 and the vertical placement direction of the light emitting devices illustrated in FIGS. 9 and 10 are shown to be opposite to each other.

As described with reference to FIG. 2, the light emitted between the first bonding portion 121 and the second bonding portion 122 may be disposed in the first recess R1. Light emitted in a lower direction of the light emitting device may be diffused by the first resin part 131, and light extraction efficiency may be improved.

In addition, according to an embodiment, the sum of the areas of the first and second bonding parts 121 and 122 may be provided to 10% or less based on the area of the top surface of the substrate 124. According to the light emitting device package according to the embodiment, in order to secure the light emitting area emitted from the light emitting device to increase the light extraction efficiency, the sum of the areas of the first and second bonding parts 121 and 122 is equal to that of the substrate 124. It may be set to 10% or less based on the upper surface area.

In addition, according to the embodiment, the sum of the areas of the first and second bonding parts 121 and 122 may be provided at 0.7% or more based on the area of the top surface of the substrate 124. According to the light emitting device package according to the embodiment, the sum of the areas of the first and second bonding parts 121 and 122 is based on the top surface area of the substrate 124 to provide stable bonding power to the light emitting device to be mounted and it can be set to more than 0.7%.

For example, the width of the first bonding part 121 along the long axis of the light emitting device may be provided in several tens of micrometers. The width of the first bonding portion 121 may be provided, for example, from 70 micrometers to 90 micrometers. In addition, the area of the first bonding part 121 may be provided in thousands of square micrometers.

In addition, the width along the long axis direction of the light emitting device of the second bonding part 122 may be provided in several tens of micrometers. The width of the second bonding portion 122 may be provided, for example, from 70 micrometers to 90 micrometers. In addition, the area of the second bonding portion 122 may be provided in thousands of square micrometers.

As described above, as the areas of the first and second bonding parts 121 and 122 are provided small, the amount of light transmitted to the bottom surface of the first light emitting device 120A may increase. In addition, the resin part 130 having good reflection characteristics may be provided under the first light emitting device 120A. Therefore, the light emitted in the lower direction of the first light emitting device 120A is reflected by the resin part 130 to be effectively emitted in the upper direction of the light emitting device package, and the light extraction efficiency can be improved.

Meanwhile, the light emitting device package according to the exemplary embodiment described above will be described based on the case where the first and second bonding parts 121 and 122 are in direct contact with the first and second conductive layers 321 and 322.

However, according to another example of the light emitting device package according to the embodiment, a separate conductive component between the first and second bonding portions 121 and 122 and the first and second conductive layers 321 and 322.

Fifth Embodiment

FIG. 11 is a plan view of a light emitting device package according to a fifth embodiment, and FIG. 12 is a cross-sectional view taken along a line A1-A1' of FIG. 11.

A light emitting device package according to an embodiment includes a plurality of frames spaced apart from each other, a body supporting the plurality of frames, a plurality of light emitting devices disposed on the plurality of frames, and a space between the body and the light emitting device and it may include a first resin.

Each of the frames may include at least one through hole, and the body may include an upper surface of the same plane as the upper surface of the frame, and the upper surface of the body may include a recess recessed to the lower surface of the body between the frames.

The first resin may be disposed in the recess, and both the through hole and the recess may overlap the light emitting device.

First, referring to FIGS. 11 and 12, an embodiment may include a plurality of frames disposed on the body 213. For example, the embodiment may include a first frame 251, a second frame 252, a third frame 253, and a fourth frame 254 spaced apart from each other.

The first frame 251 may be electrically connected to the third frame 253 by the second bridge electrode 250B2.

The second frame 252 may be electrically connected to the fourth frame 254 by the first bridge electrode 250B1.

A first conductivity type power source and a second conductivity type power source may be applied to the second frame 252 and the third frame 253, respectively. Direct power may not be applied to the first frame 251 and the fourth frame 254, and power may be applied by the first bridge electrode 250B1 and the second bridge electrode 250B2.

The first bridge electrode 250B1 and the second bridge electrode 250B2 may overlap each other. The first bridge electrode 250B1 and the second bridge electrode 250B2 may be formed of the same conductive material, or may be formed of different conductive materials.

The fifth embodiment may include a plurality of light emitting devices.

For example, the embodiment may include a first light emitting device 220A, a second light emitting device 220B, and a third light emitting device 220C.

Each light emitting device may be mounted on the frame including a first bonding portion and a second bonding portion.

For example, the first light emitting device 220A may be disposed on the first frame 251 and the second frame 252.

For example, the second light emitting device 220B may be disposed on the second frame 252 and the third frame 253.

For example, the third light emitting device 220C may be disposed on the third frame 253 and the fourth frame 254.

In the fifth embodiment, the first light emitting device 220A to the third light emitting device 220C are electrically connected in parallel, but are not limited thereto.

The embodiment may implement a compact light emitting device package by mounting the zener diode 290 on the frame.

For example, in the fifth exemplary embodiment, a zener diode 290 may be mounted on the first bridge electrode 250B1 and connected to the third frame 253 by a wire 290W.

The zener diode 290 may be a vertical light emitting device, but is not limited thereto.

In an embodiment, the zener diode 290 may be buried by an insulating reflective layer (not shown).

For example, the zener diode 290 may be buried by white silicon to prevent light absorption loss.

Referring to FIG. 12, the embodiment may include a predetermined opening TH in the body 213 on which the light emitting device is disposed, and may improve the electrical reliability by forming the conductive layer 320.

For example, the opening TH may be formed in an area overlapping the first light emitting device 220A and the third light emitting device 220C, and the conductive layer 320 may be formed in the opening TH. This will be described in detail with reference to FIG. 13.

In addition, in the embodiment, a recess (not shown) may be formed in a region overlapping the light emitting device, and a resin may be formed to improve contact force.

In an embodiment, the first bridge electrode 250B1 may be formed above the body 213, and the second bridge electrode 250B2 may be formed below the body 213, and may be exposed below.

FIG. 13 is a cross-sectional view taken along line B1-B1' in FIG. 11.

As shown in FIG. 13, the light emitting device package according to the embodiment may include a body 213 and a light emitting device 220.

The body 213 may provide a cavity C on the upper surface.

According to the embodiment, the body 213 may be provided in a structure having a cavity (C), it may be provided in a structure having a flat top surface without the cavity (C).

For example, the body 213 may be made of at least one selected from the group consisting of polyphthalamide (PPA), polychloro triphenyl (PCT), liquid crystal polymer (LCP), polyamide 9T (PA9T), silicone, epoxy molding compound (EMC), silicon molding compound (SMC), ceramic, polyimide (PI), photo sensitive glass (PSG), sapphire (Al2O3) and the like. In addition, the body 213 may include a reflective material of a high refractive filler such as TiO2 and SiO2. The body 213 may include a wavelength converting material such as a quantum dot or a phosphor.

According to an embodiment, the light emitting device 220 may include a first bonding part 221, a second bonding part 222, a light emitting structure 223, and a substrate 124.

The light emitting device 220 may include the light emitting structure 223 disposed under the substrate 124. The light emitting structure 223 may include a first conductivity type semiconductor layer, a second conductivity type semiconductor layer, an active layer disposed between the first conductivity type semiconductor layer and the second conductivity type semiconductor layer. The first bonding part 221 may be electrically connected to the first conductivity type semiconductor layer. In addition, the second bonding part 222 may be electrically connected to the second conductivity type semiconductor layer.

The light emitting device 220 may be disposed on the body 213. The light emitting device 220 may be disposed on the body 213.

The first bonding part 221 may be disposed on a lower surface of the light emitting device 220. The second bonding part 222 may be disposed on a lower surface of the light emitting device 220. The first bonding portion 221 and the second bonding portion 222 may be spaced apart from each other on the lower surface of the light emitting device 220.

The first bonding part 221 may be disposed between the light emitting structure 223 and the body 213. The second bonding part 222 may be disposed between the light emitting structure 223 and the body 213.

The first bonding portion 221 and the second bonding portion 222 are a single layer or multiple layers including one or more materials or alloys selected from the group consisting of Ti, Al, Sn, In, Jr, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO.

Meanwhile, the light emitting device package according to the embodiment may include an opening TH and an opening TH as shown in FIG. 13.

The body 213 may include the opening TH penetrating the bottom surface of the body 213 from the bottom surface of the cavity C.

The opening TH may be provided in the body 213. The opening TH may be provided through the body 213. The opening TH may pass through the upper and lower surfaces of the body 213 in a first direction.

The opening TH may be disposed under the first bonding part 221 of the light emitting device 220. The opening TH may overlap with the first bonding part 221 of the light emitting device 220. The opening TH may overlap the first bonding part 221 of the light emitting device 220 in a first direction from the upper surface of the body 213 to the lower surface.

The opening TH may be provided in an inclined form in which the width gradually decreases from the lower region to the upper region. The opening TH may be provided in an inclined form in which the width gradually decreases from the lower region to the upper region.

The light emitting device package according to the embodiment may include a recess R, as shown in FIG. 14. The recess R may be recessed from the bottom surface of the cavity C to the bottom surface of the body 213.

The recess R may be provided in the body 213. The recess R may be provided concave in a lower surface direction on an upper surface of the body 213. The recess R may be disposed under the light emitting device 220.

The recess R may be provided under the light emitting device 220 and may be provided between the first bonding part 221 and the second bonding part 222. The recess R may be provided below the light emitting device 220 in a shorter direction of the light emitting device 220.

The light emitting device package according to the embodiment may include the first resin 230, as shown in FIG. 13.

The first resin 230 may be disposed in the recess R. The first resin 230 may be disposed between the light emitting device 220 and the body 213. The first resin 230 may be disposed between the first bonding portion 221 and the second bonding portion 222. For example, the first resin 230 may be disposed in contact with a side surface of the first bonding portion 221 and a side surface of the second bonding portion 222.

The first resin 230 may be disposed around the first bonding part 221 to seal the upper region of the opening TH. The first resin 230 may be disposed around the second bonding part 222 to seal the upper region of the opening TH.

The first resin 230 may provide a stable fixing force between the light emitting device 220 and the body 213. For example, the first resin 230 may be disposed in direct contact with an upper surface of the body 213. In addition, the first resin 230 may be disposed in direct contact with the lower surface of the light emitting device 220.

For example, the first resin 230 may include at least one of an epoxy-based material, a silicon-based material, a hybrid material including an epoxy-based material and a silicon-based material. In addition, the first resin 230 may reflect light emitted from the light emitting device 220. When the first resin 230 includes a reflective function, the adhesive may include white silicone. When the first resin 230 includes a reflection function, the first resin 230 may be formed of a material including, for example, TiO2, SiO2, or the like. The first resin 230 may be referred to as an adhesive.

According to an embodiment, the depth of the recess R may be smaller than the depth of the opening TH or the depth of the opening TH.

The depth of the recess R may be determined in consideration of the adhesive force of the first resin 230. In addition, the depth T1 of the recess R may be determined so as not to generate a crack in the light emitting device package by considering a stable strength of the body 213 and/or by heat emitted from the light emitting device 220.

The recess R may provide an appropriate space under the light emitting device 220 in which a kind of under-fill process may be performed. The recess R may be provided to be greater than or equal to a first depth so that the first resin 230 is sufficiently provided between the lower surface of the light emitting device 220 and the upper surface of the body 213. In addition, the recess R may be provided at a second depth or less to provide stable strength of the body 213.

The depth and width of the recess R may affect the formation position and the fixing force of the first resin 230. The depth and width of the recess R may be determined such that sufficient fixing force may be provided by the first resin 230 disposed between the body 213 and the light emitting device 220.

In addition, the light emitting device package according to the embodiment may include a second resin 240, as shown in FIG. 13.

The second resin 240 may be provided on the light emitting device 220. The second resin 240 may be disposed on the body 213. The second resin 240 may be disposed in the cavity C provided by the second body 117.

The second resin 240 may include an insulating material. In addition, the second resin 240 may include a wavelength conversion material that receives light emitted from the light emitting device 220 and provides wavelength converted light. For example, the second resin 240 may include a phosphor, a quantum dot, and the like.

In addition, the light emitting device package according to the embodiment may include a conductive layer 320, as shown in FIG. 13.

The conductive layer 320 may be provided in the opening TH. The conductive layer 320 may be disposed under the first bonding portion 221 and the second bonding portion 222.

The first bonding part 221 may have a width in a second direction perpendicular to the first direction in which the opening TH is formed. The width of the first bonding portion 221 may be provided larger than the width of the opening TH.

The conductive layer 320 may be disposed in direct contact with the bottom surface of the first bonding part 221. The conductive layer 320 may be electrically connected to the first bonding part 221. The conductive layer 320 may be disposed to be surrounded by the body 213.

The conductive layer 320 may include at least one material selected from the group including Ag, Au, Pt, Sn, Cu, or an alloy thereof.

For example, the conductive layer 320 may be formed using a conductive paste. The conductive paste may include a solder paste, a silver paste, or the like, and may include a multilayer or a single layer composed of a multilayer or an alloy composed of different materials. For example, the conductive layer 320 may include an SAC (Sn—Ag—Cu) material.

Sixth Embodiment

FIG. 14 is a plan view of a light emitting device package according to a sixth embodiment.

The sixth embodiment can employ the technical features of the fifth embodiment, and will be described below mainly on the main features of the sixth embodiment.

First, referring to FIG. 14, an embodiment may include a plurality of frames disposed on the body 213. For example, the embodiment may include a first frame 251, a second frame 252, a third frame 253, and a fourth frame 254 spaced apart from each other. The first frame 251 may be electrically connected to the third frame 253 by the second bridge electrode 250B2. The second frame 252 may be electrically connected to the fourth frame 254 by the first bridge electrode 250B1.

A first conductivity type power source and a second conductivity type power source may be applied to the second frame 252 and the third frame 253, respectively. Direct power may not be applied to the first frame 251 and the fourth frame 254, and power may be applied by the second bridge electrode 250B2 and the first bridge electrode 250B1.

The embodiment may include a plurality of light emitting devices.

For example, the embodiment may include a first light emitting device 220A, a second light emitting device 220B, a third light emitting device 220C, and a fourth light emitting device 220D. Each light emitting device may be mounted on the frame including a first bonding portion and a second bonding portion.

For example, the first light emitting device 220A may be disposed on the first frame 251 and the second frame 252.

For example, the second light emitting device 220B may be disposed on the second frame 252 and the third frame 253.

For example, the third light emitting device 220C may be disposed on the third frame 253 and the fourth frame 254.

For example, the fourth light emitting device 220D may be disposed on the fourth frame 254 and the first frame 251.

In the fifth embodiment, the first light emitting device 220A to the fourth light emitting device 220D are electrically connected in parallel, but are not limited thereto.

The embodiment may implement a compact light emitting device package by mounting the zener diode 290 on the frame.

For example, the embodiment may mount the zener diode 290 on the first bridge electrode 250B1 and may be connected to the third frame 253 by a wire 290W. The zener diode 290 may be a vertical light emitting device, but is not limited thereto.

In an embodiment, the zener diode 290 may be buried by an insulating reflective layer (not shown). For example, the zener diode 290 may be buried by white silicon to prevent light absorption loss.

In an embodiment, the first bridge electrode 250B1 may be formed above the body 213, and the second bridge electrode 250B2 may be formed below the body 213, and may be exposed below.

Seventh Example

FIG. 15 is a plan view of a light emitting device package according to a seventh embodiment.

The seventh embodiment can employ the technical features of the fifth to sixth embodiments, and will be described below mainly on the main features of the seventh embodiment.

Referring to FIG. 15, an embodiment may include a plurality of frames disposed on the body 213. For example, the embodiment may include a first frame 251, a second frame 252, a third frame 253, and a fourth frame 254 spaced apart from each other. The first frame 251 may be electrically connected to the third frame 253 by the second bridge electrode 250B2. The second frame 252 may be electrically connected to the fourth frame 254 by the first bridge electrode 250B1.

A first conductivity type power source and a second conductivity type power source may be applied to the second frame 252 and the third frame 253, respectively. Direct power may not be applied to the first frame 251 and the fourth frame 254, and power may be applied by the second bridge electrode 250B2 and the first bridge electrode 250B1.

The embodiment may include a plurality of light emitting devices.

For example, the embodiment may include a first light emitting device 220A, a second light emitting device 220B, and a third light emitting device 220C. Each light emitting device may be mounted on the frame including a first bonding portion and a second bonding portion.

For example, the first light emitting device 220A may be disposed on the first frame 251 and the second frame 252.

For example, the second light emitting device 220B may be disposed on the second frame 252 and the third frame 253.

For example, the third light emitting device 220C may be disposed on the third frame 253 and the fourth frame 254.

In the exemplary embodiment, the first light emitting devices 220A to 220C are electrically connected in parallel, but are not limited thereto.

Compared to the seventh embodiment, the fifth embodiment can improve light intensity by disposing a long-axis light emitting device.

According to the seventh exemplary embodiment, a compact light emitting device package may be realized by disposing a single light emitting device as compared with the fifth embodiment.

The embodiment may implement a compact light emitting device package by mounting the zener diode 290 on the frame.

For example, the embodiment may mount the zener diode 290 on the first bridge electrode 250B1 and may be connected to the third frame 253 by a wire 290W. The zener diode 290 may be a vertical light emitting device, but is not limited thereto.

In an embodiment, the zener diode 290 may be buried by an insulating reflective layer (not shown). For example, the zener diode 290 may be buried by white silicon to prevent light absorption loss.

In an embodiment, the first bridge electrode 250B1 may be formed above the body 213, and the second bridge electrode 250B2 may be formed below the body 213, and may be exposed below.

Eighth Embodiment

FIGS. 16 and 17 are plan views and cross-sectional views of a light emitting device package according to an eighth embodiment.

A light emitting device package according to an embodiment includes a plurality of frames spaced apart from each other, a body supporting the plurality of frames, a plurality of light emitting devices disposed on the plurality of frames, and a space between the body and the light emitting device and a first resin.

Each of the frames may include at least one through hole, and the body may include an upper surface of the same plane as the upper surface of the frame, and the upper surface of the body may include a recess recessed to the lower surface of the body between the frames.

The first resin may be disposed in the recess, and both the through hole and the recess may overlap the light emitting device.

First, referring to FIGS. 16 and 17, an embodiment may include a plurality of frames disposed on the body 213. For example, the embodiment may include a first frame 251, a second frame 252, a third frame 253, and a fourth frame 254 spaced apart from each other.

In the present embodiment, the first light emitting device 220A to the third light emitting device 220C are electrically connected in series, but are not limited thereto.

A first conductive power source and a second conductive power source may be applied to the first frame 251 and the fourth frame 254, respectively. Direct power may not be applied to the second frame 252 and the third frame 253.

The embodiment may include a plurality of light emitting devices.

For example, the embodiment may include a first light emitting device 220A, a second light emitting device 220B, and a third light emitting device 220C.

Each light emitting device may be mounted on the frame including a first bonding portion and a second bonding portion.

For example, the first light emitting device 220A may be disposed on the first frame 251 and the second frame 252. For example, the second light emitting device 220B may be disposed on the second frame 252 and the third frame 253. For example, the third light emitting device 220C may be disposed on the third frame 253 and the fourth frame 254.

In the present embodiment, the first light emitting device 220A to the third light emitting device 220C are electrically connected in series, but are not limited thereto.

For example, power may be applied to the first frame 251 and the fourth frame 254, and direct power may not be applied to the second frame 252 and the third frame 253. The device 220A may be electrically connected to the second light emitting device 220B and the third light emitting device 220C.

The embodiment may implement a compact light emitting device package by mounting the zener diode 290 on the frame.

For example, in the present exemplary embodiment, the zener diode 290 may be mounted on the protruding electrode 251P extending from the first frame 251, and may be connected to the fourth frame 253 by the wire 290W.

In an embodiment, the zener diode 290 may be buried by an insulating reflective layer (not shown). For example, the zener diode 290 may be buried by white silicon to prevent light absorption loss.

The zener diode 290 may be a vertical light emitting device, but is not limited thereto.

The protruding electrode 251P may be partially exposed to the upper side of the body 213.

Referring to FIG. 17, the embodiment may include a predetermined opening TH in the body 213 on which the light emitting device is disposed, and may improve the electrical reliability by forming the conductive layer 320. For example, the opening TH may be formed in an area overlapping the first light emitting device 220A and the third light emitting device 220C, and the conductive layer 320 may be formed in the opening TH.

In addition, in the embodiment, a recess (not shown) may be formed in a region overlapping the light emitting device, and a resin may be formed to improve contact force.

Example 9

FIG. 18 is a cross-sectional view of the light emitting device package according to the ninth embodiment.

Referring to FIG. 18, the embodiment may include a plurality of frames disposed on the body 213. For example, the embodiment may include a first frame 251, a second frame 252, a third frame 253, and a fourth frame 254 spaced apart from each other.

In the present exemplary embodiment, the first light emitting device 220A and the second light emitting device 220B are connected in series, and the third light emitting device 220C and the fourth light emitting device 220D are electrically connected in series. Accordingly, the overall parallel connection structure may be provided.

A first conductive type power source and a second conductive type power source may be applied to the first frame 251 and the third frame 253, respectively. Direct power may not be applied to the second frame 252 and the fourth frame 254.

The embodiment may include a plurality of light emitting devices.

For example, the embodiment may include a first light emitting device 220A, a second light emitting device 220B, a third light emitting device 220C, and a fourth light emitting device 220D.

Each light emitting device may be mounted on the frame including a first bonding portion and a second bonding portion.

For example, the first light emitting device 220A may be disposed on the first frame 251 and the second frame 252. For example, the second light emitting device 220B may be disposed on the second frame 252 and the third frame 253. For example, the third light emitting device 220C may be disposed on the third frame 253 and the fourth frame 254. For example, the fourth light emitting device 220D may be disposed on the fourth frame 254 and the first frame 251.

The embodiment may implement a compact light emitting device package by mounting the zener diode 290 on the frame.

For example, in the present embodiment, the zener diode 290 may be mounted on the protruding electrode 251P extending from the first frame 251, and may be connected to the fourth frame 253 by the wire 290W.

In an embodiment, the zener diode 290 may be buried by an insulating reflective layer (not shown). For example, the zener diode 290 may be buried by white silicon to prevent light absorption loss.

The zener diode 290 may be a vertical light emitting device, but is not limited thereto.

The protruding electrode 251P may be partially exposed to the upper side of the body 213.

Example 10

FIG. 19 is a plan view of a light emitting device package according to the tenth embodiment.

Referring to FIG. 19, an embodiment may include a plurality of frames disposed on the body 213. For example, the embodiment may include a first frame 251, a second frame 252, a third frame 253, and a fourth frame 254 spaced apart from each other.

In the present embodiment, the first light emitting device 220A to the third light emitting device 220C are electrically connected in series, but are not limited thereto.

First conductive power and second conductive power may be applied to the first frame 251 and the fourth frame 254, respectively. Direct power may not be applied to the second frame 252 and the third frame 253.

The embodiment may include a plurality of light emitting devices. For example, the embodiment may include a first light emitting device 220A, a second light emitting device 220B, and a third light emitting device 220C.

Each light emitting device may be mounted on the frame including a first bonding portion and a second bonding portion.

For example, the first light emitting device 220A may be disposed on the first frame 251 and the second frame 252. For example, the second light emitting device 220B may be disposed on the second frame 252 and the third frame 253. For example, the third light emitting device 220C may be disposed on the third frame 253 and the fourth frame 254.

In the present embodiment, the first light emitting device 220A to the third light emitting device 220C are electrically connected in series, but are not limited thereto.

For example, power may be applied to the first frame 251 and the fourth frame 254, and direct power may not be applied to the second frame 252 and the third frame 253. The device 220A may be electrically connected to the second light emitting device 220B and the third light emitting device 220C.

The embodiment may implement a compact light emitting device package by mounting the zener diode 290 on the frame.

For example, in the present embodiment, the zener diode 290 may be mounted on the protruding electrode 251P extending from the first frame 251, and may be connected to the fourth frame 253 by the wire 290W.

In an embodiment, the zener diode 290 may be buried by an insulating reflective layer (not shown). For example, the zener diode 290 may be buried by white silicon to prevent light absorption loss.

The zener diode 290 may be a vertical light emitting device, but is not limited thereto.

The protruding electrode 251P may be partially exposed to the upper side of the body 213.

According to the embodiment, it is possible to provide a light emitting device package having high reliability while providing high output, and having a compact semiconductor package size, a method of manufacturing the same, and a lighting device including the same.

In addition, according to the embodiment, it is possible to provide a light emitting device package, a manufacturing method thereof, and a lighting device including the same, which can improve bonding force between the package body and the light emitting device.

In addition, according to the embodiment, it is possible to provide a light emitting device package having an excellent electrical and physical reliability in the bonding region between the electrode of the package body and the electrode of the light emitting device, a manufacturing method thereof and a lighting device including the same.

For example, according to the light emitting device package and the manufacturing method for the light emitting device according to the embodiment, the re-melting phenomenon is prevented from occurring in the bonding region of the light emitting device package while the light emitting device package is rebonded to the substrate or the like. There is an advantage to this.

In addition, according to the embodiment, it is possible to provide a light emitting device package, a manufacturing method thereof, and a lighting device including the same, which can improve the brightness.

In addition, according to the embodiment, it is possible to provide a light emitting device package, a manufacturing method thereof, and a lighting device including the same, which can reduce manufacturing cost and improve manufacturing yield by improving process efficiency and changing a structure.

The technical effects of the embodiments are not limited to those described in this section, but include those that can be understood through the description of the invention.

INDUSTRIAL APPLICABILITY

The light emitting device package according to the embodiment described above may be applied to the lighting device.

In addition, the lighting device may include a display device, a lighting device, a head lamp, or the like according to an industrial field.

As an example of the lighting device, the display device includes a bottom cover, a reflector disposed on the bottom cover, a light emitting module emitting light and including a light emitting device, and a light disposed in front of the reflector and guiding light emitted from the light emitting module to the front. An optical sheet including a light guide plate, prism sheets disposed in front of the light guide plate, a display panel disposed in front of the optical sheet, an image signal output circuit connected to the display panel and supplying an image signal to the display panel, it may include a color filter disposed in front. The bottom cover, the reflector, the light emitting module, the light guide plate, and the optical sheet may form a backlight unit. In addition, the display device does not include a color filter, and may have a structure in which light emitting devices emitting red, green, and blue light are disposed.

As another example of the light source apparatus, the head lamp includes a light emitting module including a light emitting device package disposed on a substrate, a reflector reflecting light emitted from the light emitting module in a predetermined direction, for example, a front reflector. It may include a lens for refracting the light forward, and a shade for blocking or reflecting a portion of the light reflected by the reflector toward the lens to achieve a light distribution pattern desired by the designer.

Another example of a lighting device may include a lighting device, a cover, a light source module, a heat sink, a power supply, an inner case, and a socket. In addition, the lighting device according to the embodiment may further include any one or more of the members and the holder. The light source module may include a light emitting device package according to an embodiment.

Features, structures, effects, etc. described in the above embodiments are included in at least one embodiment, but are not necessarily limited to one embodiment. Furthermore, the features, structures, effects, and the like illustrated in the embodiments may be combined or modified with respect to other embodiments by those skilled in the art to which the embodiments belong. Therefore, it should be interpreted that the contents related to such combinations and modifications are included in the scope of the embodiments.

Although the embodiments have been described above, the embodiments are only examples, and are not intended to limit the embodiments. Those skilled in the art to which the embodiments belong will not change the essential characteristics of the embodiments. It will be appreciated that modifications and applications of the branches are possible. For example, each component specifically shown in the embodiment can be modified. And differences related to such modifications and applications will have to be construed as being included in the scope of the embodiments set out in the appended claims.

The invention claimed is:

1. A light emitting device package comprising:
a first frame and a second frame spaced apart from each other;
a third frame disposed between the first frame and the second frame, and spaced apart from the first frame and the second frame;
a body supporting the first to third frames, having a first recess in an upper region between the first frame and the third frame and a second recess in an upper region between the third frame and the second frame;
a first light emitting device disposed on the body and electrically connected to the first frame and the third frame;
a second light emitting device disposed on the body and electrically connected to the second frame and the third frame; and
a first resin part disposed in the first recess and a second resin part disposed in the second recess,
wherein the first light emitting device includes a first bonding part and a second bonding part, and is disposed on the first resin part and electrically connected to the first frame and the third frame, and
wherein the second light emitting device includes a third bonding part and a fourth bonding part, and is disposed on the second resin part and electrically connected to the second frame and the third frame.

2. The light emitting device package of claim 1, wherein the first frame includes a first opening, the third frame includes a second opening and a third opening, and the second frame includes a fourth opening.

3. The light emitting device package of claim 2, wherein first to fourth conductive layers are respectively disposed in the first to fourth openings, and each of the first to fourth openings overlaps each other in a vertical direction with the first to fourth bonding parts.

4. The light emitting device package of claim 1, wherein the first frame and the second frame have a smaller size than the third frame.

5. The light emitting device package of claim 4, wherein the first frame and the second frame are disposed to overlap each other.

6. The light emitting device package of claim 1, further comprising a fourth frame spaced apart from the third frame and the second frame between the third frame and the second frame.

7. The light emitting device package of claim 6, wherein each of the first frame and the second frame has a smaller size than each of the third frame and the fourth frame.

8. The light emitting device package of claim 7, wherein the first frame and the second frame are spaced apart from each other, and the third frame and the fourth frame are disposed between the first frame and the second frame,
wherein the third frame is disposed in a direction perpendicular to a longitudinal direction of the first light emitting device, and
wherein a portion of the fourth frame is disposed in a direction perpendicular to the longitudinal direction of the first light emitting device such that the portion of the fourth frame overlaps with the third frame and the portion of the fourth frame overlaps with the second frame.

9. A light emitting device package comprising:
a plurality of frames spaced apart from each other;
a body supporting the plurality of frames;
a plurality of light emitting devices disposed on the plurality of frames; and
a first resin disposed between the body and the light emitting devices,
wherein each of the frames includes at least one through hole,
wherein the body includes an upper surface having a same plane as an upper surface of the frames,
wherein the body includes a plurality of recesses,
wherein the first resin is disposed in the plurality of recesses, and
wherein a corresponding through hole and a corresponding recess overlap with a corresponding light emitting device.

10. A light emitting device comprising a light emitting unit comprising the light emitting device package according to claim 1.

11. The light emitting device package of claim 1, wherein a bottom surface of the first resin part is disposed lower than the upper surface of the body.

12. The light emitting device package of claim 1, wherein a material of the first resin part is different from a material of the body.

13. The light emitting device package of claim 1, further comprising a third resin part disposed between an outside of the first bonding part and the second bonding part of the first light emitting device and the first lead frame.

14. The light emitting device package of claim 13, wherein the first frame includes a third recess on an upper surface thereof, and the third resin part is disposed in the third recess.

15. The light emitting device package of claim 14, wherein the third recess is provided concave in a lower surface direction from the upper surface of the first frame.

16. The light emitting device package of claim 15, wherein the first frame includes a first opening, and the third recess is spaced apart from the first opening in the outward direction of the body.

17. The light emitting device package of claim 16, wherein a side surface of the third recess includes an inclined surface.

18. The light emitting device package of claim 17, wherein the side surface of the third recess includes an inclined curvature surface.

19. The light emitting device package of claim 3, wherein a width of an upper region of the first conductive layer is smaller than that of the first bonding portion.

20. The light emitting device package of claim 19, wherein a lower region of the first conductive layer includes an extended region inclined downward, and a width of the lower region is larger than that of the upper region of the first conductive layer.

* * * * *